US012588439B2

(12) United States Patent
Chen et al.

(10) Patent No.: US 12,588,439 B2
(45) Date of Patent: Mar. 24, 2026

(54) METHOD OF MANUFACTURING SEMICONDUCTOR STRUCTURE WITH SPACER ON PHOTORESIST LAYER

(71) Applicant: TAIWAN SEMICONDUCTOR MANUFACTURING COMPANY, LTD., Hsinchu (TW)

(72) Inventors: Chin-Ta Chen, Hsinchu City (TW); Han-Wei Wu, Tainan City (TW); Yuan-Hsiang Lung, Hsinchu City (TW); Hua-Tai Lin, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 737 days.

(21) Appl. No.: 17/838,246

(22) Filed: Jun. 12, 2022

(65) Prior Publication Data

US 2023/0402277 A1     Dec. 14, 2023

(51) Int. Cl.
*H01L 21/02* (2006.01)
*H01L 21/027* (2006.01)

(52) U.S. Cl.
CPC .... *H01L 21/02112* (2013.01); *H01L 21/0226* (2013.01); *H01L 21/0273* (2013.01)

(58) Field of Classification Search
CPC ........... H01L 21/02112; H01L 21/0226; H01L 21/0273
See application file for complete search history.

(56) References Cited

U.S. PATENT DOCUMENTS

| | | | | |
|---|---|---|---|---|
| 5,895,740 A * | 4/1999 | Chien | H01L 21/76816 | 216/17 |
| 7,807,575 B2 * | 10/2010 | Zhou | H01L 21/3088 | 430/323 |
| 10,170,307 B1 * | 1/2019 | Huang | G03F 7/091 | |
| 2006/0188824 A1 * | 8/2006 | Chuang | H01L 23/481 | 430/313 |
| 2011/0171815 A1 * | 7/2011 | Nguyen | H01L 21/0337 | 438/702 |
| 2012/0108056 A1 * | 5/2012 | Park | H01L 21/76816 | 257/E21.577 |
| 2015/0140811 A1 * | 5/2015 | Huang | H01L 21/0273 | 438/669 |
| 2015/0318173 A1 * | 11/2015 | Shih | H01L 21/0228 | 438/702 |
| 2020/0176307 A1 * | 6/2020 | Shih | H01L 23/5283 | |
| 2021/0407812 A1 * | 12/2021 | Lin | H01L 21/3065 | |

* cited by examiner

*Primary Examiner* — Lex H Malsawma
(74) *Attorney, Agent, or Firm* — Maschoff Brennan

(57) ABSTRACT

A method includes depositing a dielectric layer over a semiconductor substrate; forming a first photoresist layer over the dielectric layer; patterning the first photoresist layer to form through holes, such that a first portion of the first photoresist layer between a first one and a second one of the through holes has a less height than a second portion of the first photoresist layer between the first one and a third one of the through holes; forming a spacer on the first portion of the first photoresist layer; performing an etching process on the dielectric layer to form via holes while the spacer remains covering the first portion of the first photoresist layer; forming a plurality of metal vias in the via holes.

20 Claims, 25 Drawing Sheets

C-C'

93
92
91
90
18
70

B-B'

93
92
91
90
18
70

C-C'

B-B'

C-C'

B-B'

C-C'

B-B'

C-C'

B-B'

METHOD OF MANUFACTURING SEMICONDUCTOR STRUCTURE WITH SPACER ON PHOTORESIST LAYER

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
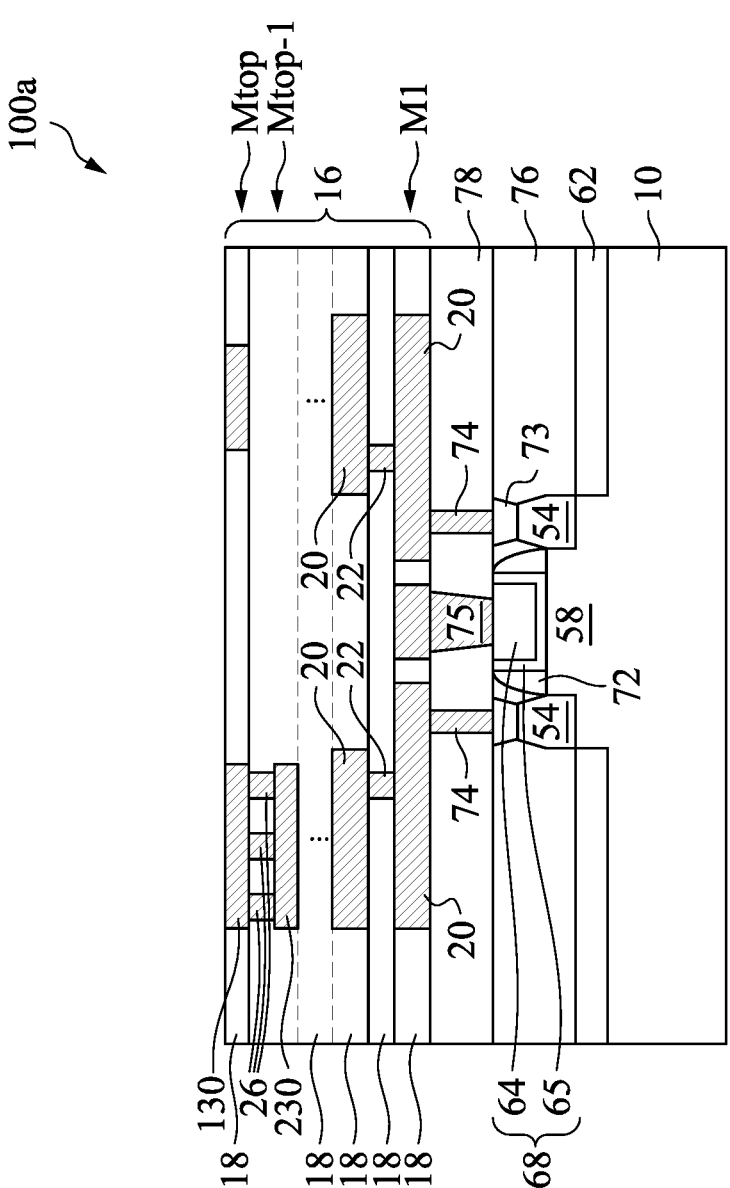
FIG. 1 illustrates a schematic view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

In the course of IC evolution, the decreasing geometry sizes may lead to various manufacturing difficulties. For example, a tri-layer photoresist may be used to pattern layers in semiconductor processes. However, as the device sizes become smaller, the use of tri-layer photoresist may cause hole to hole bridge, which may degrade semiconductor device performance or even lead to device failures. Therefore, the present disclosure in various embodiments provides a spacer merge process performed on the tri-layer photoresist to solve bridge issue between adjacent two via holes in the patterning, which in turn reduces a via hole bridge risk in the routing. In some embodiments, the spacer merge process performed on the tri-layer photoresist may be applied to the formation of metal vias in the wafer 100a as shown in FIG. 1.

With reference to FIG. 1, a wafer 100a, which includes a semiconductor substrate 10, is provided. The semiconductor substrate 10 may be a bulk silicon substrate or a silicon-on-insulator substrate. Alternatively, other semiconductor materials that include group III, group IV, and group V elements may also be used, which may include silicon germanium, silicon carbon, and III-V compound semiconductor materials.

A semiconductor device 64, which are symbolized using a transistor, may be formed at a surface of the semiconductor substrate 10. A fin-type field effect transistor (FinFET) device is disposed on the substrate 10. In some embodiments, the FinFET device illustrated in FIG. 1 is a three-dimensional MOSFET structure formed in fin-like strips of semiconductor protrusions 58 referred to as fins. The cross-section shown in FIG. 1 is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 10 using, for example, reactive ion etching (RIE). FIG. 1 illustrates a single fin 58, although the substrate 10 may include any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58 protrudes from surrounding insulating STI regions 62. In some cases, the patterned hard mask used to form the fins 58 may also be removed by the planarization process.

In some embodiments, the gate structure 68 of the FinFET device illustrated in FIG. 1 is a high-k, metal gate (HKMG) gate structure that may be formed using a gate-last process flow. In a gate last process flow, a sacrificial dummy gate structure (not shown) is formed after forming the STI regions 62. The dummy gate structure may include a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 62. As described in greater detail below, the dummy gate structure may be replaced by the HKMG gate structure 68 as illustrated in FIG. 1. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET, illustrated in FIG. 1, are formed, for example, self-aligned to the dummy gate structure. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structure leaving the spacers 72 along the sidewalls of the dummy gate structure extending laterally onto a portion of the surface of the fin (as illustrated in the right side of FIG. 1) or the surface of the STI dielectric (as illustrated in the left side of FIG. 1).

Source and drain regions 54 are semiconductor regions in direct contact with the semiconductor fin 58. In some embodiments, the source and drain regions 54 may include heavily-doped regions and relatively lightly-doped drain extensions, or LDD regions. Generally, the heavily-doped regions are spaced away from the dummy gate structure using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may include an epitaxially grown region. For example, after forming the LDD regions, the spacers 72 may be formed and, subsequently, the heavily-doped source and drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to $10^{16}$ cm$^{-2}$) of dopants may be introduced into the heavily-doped source and drain regions 54 either in situ during SEG, or by an ion implantation process performed after the SEG, or by a combination thereof.

An interlayer dielectric (ILD) 76 (seen in FIG. 1) is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the ILD layer 76. The HKMG gate structure 68, illustrated in FIG. 1, may then be formed by first removing the dummy gate structure using one or more etching techniques, thereby creating trenches between respective spacers 72. Subsequently, a replacement gate dielectric layer 65 comprising one more dielectrics, followed by a replacement conductive gate layer 64 comprising one or more conductive materials, are deposited to completely fill the recesses. Excess portions of the gate structure layers 64 and 65 may be removed from over the top surface of ILD layer 76 using, for example a CMP process. The resulting structure, as illustrated in FIG. 1, may be a substantially coplanar surface comprising an exposed top surface of ILD layer 76, spacers 72, and remaining portions of the HKMG gate layers 65 and 64 inlaid between respective spacers 72.

The gate dielectric layer 65 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 64 may be a multilayered metal gate stack comprising a barrier layer, a work function layer, and a gate-fill layer formed successively on top of gate dielectric layer 65. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may include metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

Source/drain contacts 73 are formed in the ILD layer 76 and make electrical connections to the source and drain regions 54 of FinFET. The source/drain contacts 73 may be formed using photolithography techniques. For example, a patterned mask may be formed over the ILD layer 76 and used to etch openings that extend through the ILD layer 76 and the CESL (not shown) below ILD layer 76 to expose portions of the source and drain regions 54. In some embodiments, an anisotropic dry etch process may be used.

In some embodiments, a conductive liner may be formed in the openings in the ILD layer 76. Subsequently, the openings are filled with a conductive fill material. The liner includes barrier metals used to reduce out-diffusion of conductive materials from the source/drain contacts 73 into the surrounding dielectric materials. In some embodiments, the liner may include two barrier metal layers. The first barrier metal comes in contact with the semiconductor material in the source and drain regions 54 and may be subsequently chemically reacted with the heavily-doped semiconductor in the source and drain regions 54 to form a low resistance ohmic contact, after which the unreacted metal may be removed. For example, if the heavily-doped semiconductor in the source and drain regions 54 is silicon or silicon-germanium alloy semiconductor, then the first barrier metal may include Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the ILD layer 76. The resulting conductive plugs extend into the ILD layer 76 and constitute the source/drain contacts 73 making physical and electrical connections to the electrodes of electronic devices, such as the FinFET illustrated in FIG. 1.

An ILD layer 78 may be deposited over the ILD layer 76, as illustrated in FIG. 1. In some embodiments, the insulating materials to form the ILD layer 76 and the ILD layer 78 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/ aerogels), or the like, or a combination thereof. The dielectric materials used to form the ILD layer 76 and the ILD layer 78 may be deposited using any suitable method, such as CVD, physical vapor deposition (PVD), ALD, PEALD, PECVD, SACVD, FCVD, spin-on coating, and/or the like, or a combination thereof.

As illustrated in FIG. 1, source/drain vias 74 are formed in the ILD layer 78 and making electrical connections to corresponding source/drain contacts 73. Gate contact are formed in the ILD layer 78 and making electrical connection to corresponding gate electrode 64 of FinFET, respectively. The gate contact 75, the source/drain contacts 73, and the source/drain vias 74 can be referred to as middle-end-of-line (MEOL) conductive features that electrically connect front-end-of-line (FEOL) conductive features (for example, gate structure 68 and/or source/drain regions 54) to back-end-of-line (BEOL) conductive features (for example, metal vias and metal lines in an interconnect structure 16). The gate contact 75 and the source/drain vias 74 may be formed using photolithography techniques. For example, a patterned mask may be formed over the ILD layer 78 and used to etch openings that extend through the ILD layer 78 to expose a portion of gate electrode over STI regions 62 and the source/drain contacts 73. In some embodiments, an anisotropic dry etch process may be used to etch the openings.

In some embodiments, a conductive liner may be formed in the openings in the ILD layer 78. Subsequently, the openings are filled with a conductive fill material. The liner includes barrier metals used to reduce out-diffusion of conductive materials from the gate contact 75 and the source/drain vias 74 into the surrounding dielectric materials. In some embodiments, the liner may include two barrier metal layers. The first barrier metal may include Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material may be deposited over the conductive liner layer to fill the contact openings, using any acceptable deposition technique (e.g., CVD, ALD, PEALD, PECVD, PVD, ECP, electroless plating, or the like, or any combination thereof). The conductive fill material may be tungsten (W) or other suitable conductive materials, such as Al, Cu, Ru, Ni, Co, alloys of these, combinations thereof, and the like. Next, a planarization process (e.g., CMP) may be used to remove excess portions of all the conductive materials from over the surface of the second ILD layer 78. The resulting conductive plugs extend into the second ILD layer 78 and constitute gate contact 75 and the source/drain vias 74 making physical and electrical connections to the gate electrode 64 and the source/drain contacts 73, respectively. In some embodiments, each of the source/drain contacts 73, the source/drain vias 74, and the gate contact 75 may include an inverted trapezoid cross-sectional profile. That is, widths of the source/drain contacts 73, the source/drain vias 74, and the gate contact 75 may increase as a distance from the substrate 10 increases.

The wafer 100a may further include an interconnect structure 16 over the ILD layer 78. The interconnect structure 16 includes metal lines 20 and metal vias 22, which are formed in dielectric layers 18. The combination of the metal lines 20 at a same level is referred to a metal layer hereinafter. Accordingly, the interconnect structure 16 may include a plurality of metal layers that are interconnected through the metal vias 22. The metal lines 20 and metal vias 22 may be formed of copper or copper alloys, although they can also be formed of other metals. In some embodiments, the metal lines 20 and/or metal vias 22 may include a conducting material, for example, metals such as Al, Ti, TiN, TaN, Co, Ag, Au, Ni, Cr, Hf, Ru, W, Pt, WN, Ru, any other suitable material or a combination or alloy thereof. In some embodiments, the dielectric layers 18 are formed of low-k dielectric materials. The dielectric constants (k values) of the low-k dielectric materials may be less than about 3.0, or less than about 2.5, for example. In some embodiments, the metal layers include a bottom metal layer (M1) through a top metal layer (Mtop). In some embodiments, the Mtop layer is the topmost metal layer that is formed in low-k dielectric materials. A metal pad 130 may be formed in the Mtop layer. A metal pad 230 may also be formed in Mtop−1 layer, which is the metal layer immediately underlying the Mtop layer. The metal pads 130 and 230 are interconnected through metal vias 26.

The present disclosure in various embodiments provides a spacer merge process (see FIGS. 4A-5C) performed on the tri-layer photoresist to solve bridge issue between adjacent two openings, trenches, and/or via holes for forming metal feature, such as the metal vias 22 as shown in FIG. 1. Therefore, a via hole bridge risk in the routing may be reduced.

Figure 2A:
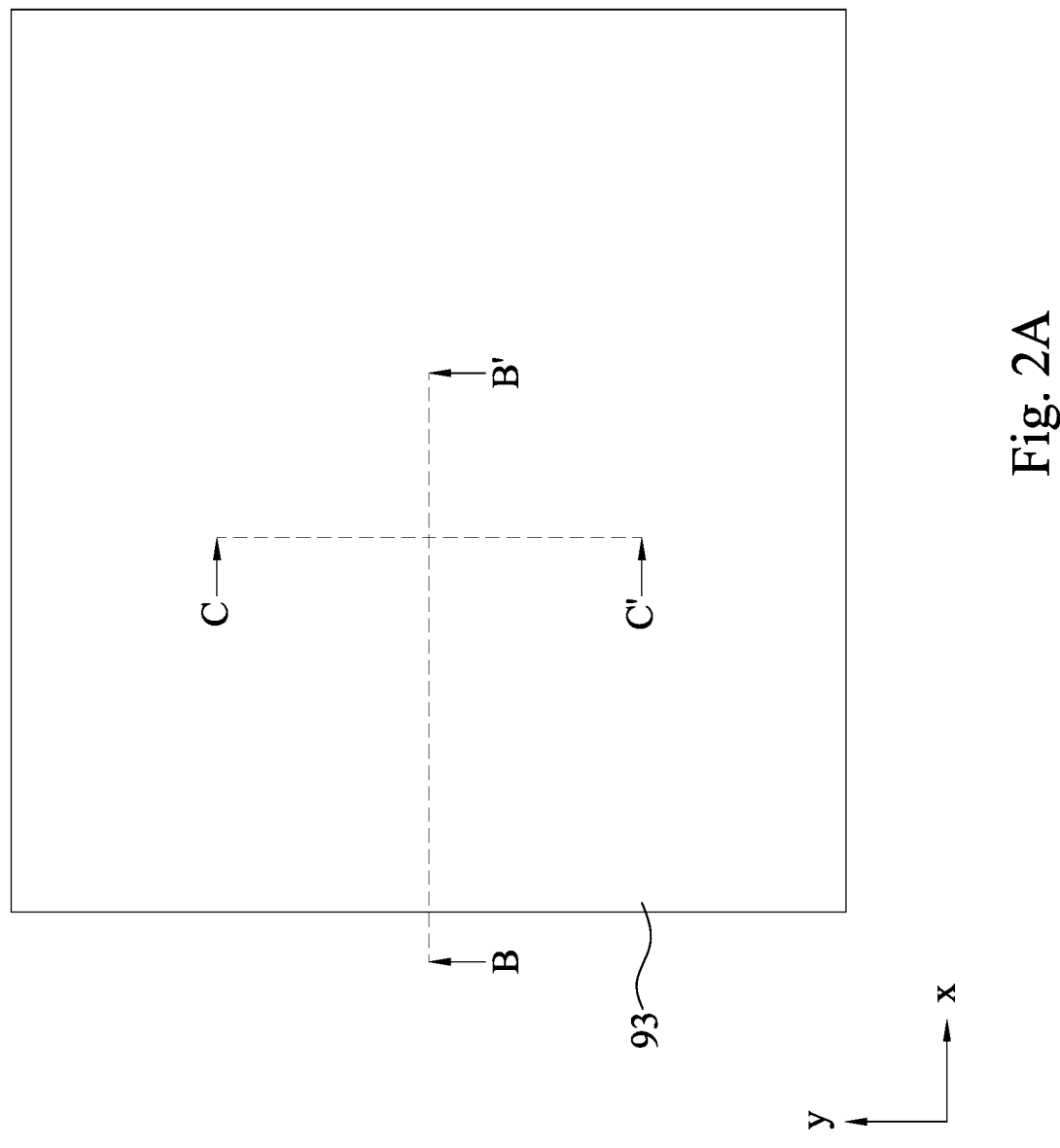
FIGS. 2A-5C and 6A-10C illustrate the cross-sectional views and top views of intermediate stages in the formation of vias of interconnect structure in a semiconductor structure over a substrate in accordance with some embodiments.
Figures 2B, 2C:
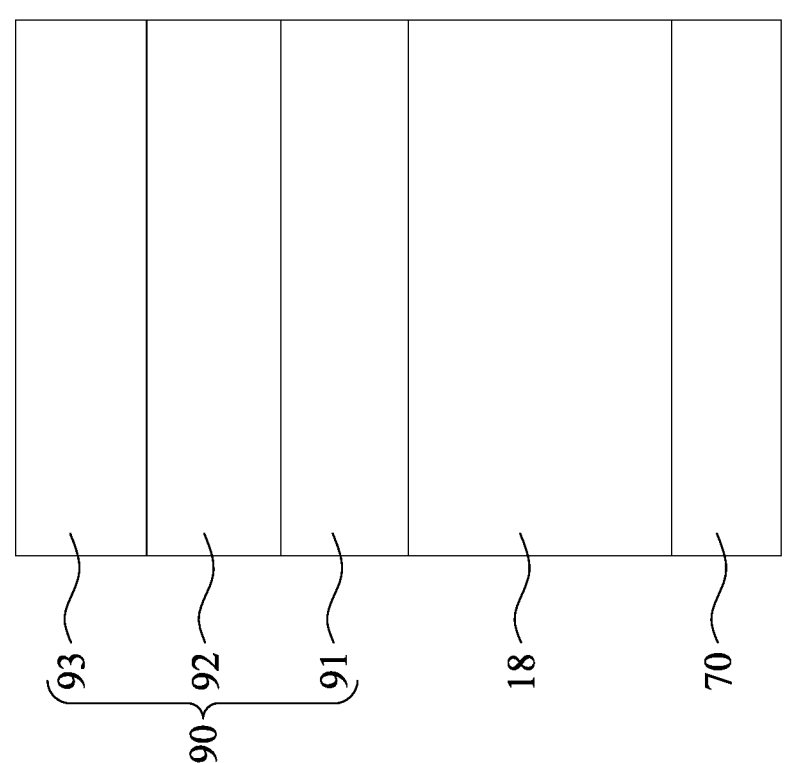

With reference to FIGS. 2A, 2B, and 2C, a tri-layer photoresist 90 is formed over one of the dielectric layers 18 (see FIG. 1) over a substrate 70. In some embodiments, the elements and features below the dielectric layers 18 as illustrated in FIG. 1 can be collectively referred to the substrate 70. In some present embodiments, the tri-layer photoresist 90 includes a bottom layer 91, a middle layer 92 over the bottom layer 91, and a top layer 93 over the middle layer 92. In some embodiments, the bottom layer 91 is a bottom anti-reflective coating (BARC) layer which is used to reduce reflection during the photolithography process. In some embodiments, the bottom layer 91 may be made of nitrogen-free material, such as silicon rich oxide, or silicon oxycarbide (SiOC). In some embodiments, the bottom layer 91 can be interchangeably referred to as a photoresist layer or a hard mask layer. In some embodiments, the bottom layer 91 may be made of a $C_xH_yO_z$ material. In some embodiments, the middle layer 92 may be made of silicon-based material, such as silicon nitride, silicon oxynitride or silicon oxide. In some embodiments, the middle layer 92 may be made of a $SiC_xH_yO_z$ material. In some embodiments, the ratio of the thickness of the bottom layer 91 to the thickness of the middle layer 92 is in a range from about 4 to about 8. In some embodiments, the middle layer 92 can be interchangeably referred to as a photoresist layer or a hard mask layer.

In some embodiments, the top layer 93 may be a positive photoresist layer or a negative photoresist layer. In some embodiments, the top layer 93 may be made of Poly (methyl methacrylate) (PMMA), Poly (methyl glutarimide) (PMGI), Phenol formaldehyde resin (DNQ/Novolac). In some embodiments, the top layer 93 may further include a photosensitive element, such as a photo-acid generator (PAG). This allows a photolithography process to be performed to pattern the top layer 93. In some embodiments, the top layer 93 may be made of s a $C_xH_yO_z$ material. In some embodiments, the top layer 93 may be made of a different material than the bottom layer 91. In some embodiments, the top layer 93 may be made of a same material as the bottom layer 91. In some embodiments, the top layer 93 is patterned by a photolithography process, which may include one or more exposure, developing, rinsing, and baking processes. The photolithography process patterns the top layer 93 into a photoresist mask, which may have one or more via holes, trenches, and/or openings that expose the middle layer 92 therebelow. The middle layer 92 is then etched using the photoresist mask to form a patterned middle layer 92 (see FIG. 6B), and the bottom layer 91 is then etched using the patterned middle layer 92 to form a patterned bottom layer 91 (see FIG. 6B). The patterned bottom layer 91 is then used to pattern the various layers below. It is understood that in other embodiments, one or more layers of the tri-layer photoresist may be omitted, or additional layers may be provided as a part of the tri-layer photoresist, and the layers may be formed in difference sequences. In some embodiments, the top layer 93 can be interchangeably referred to as a photoresist layer or a hard mask layer.

Figure 3A:
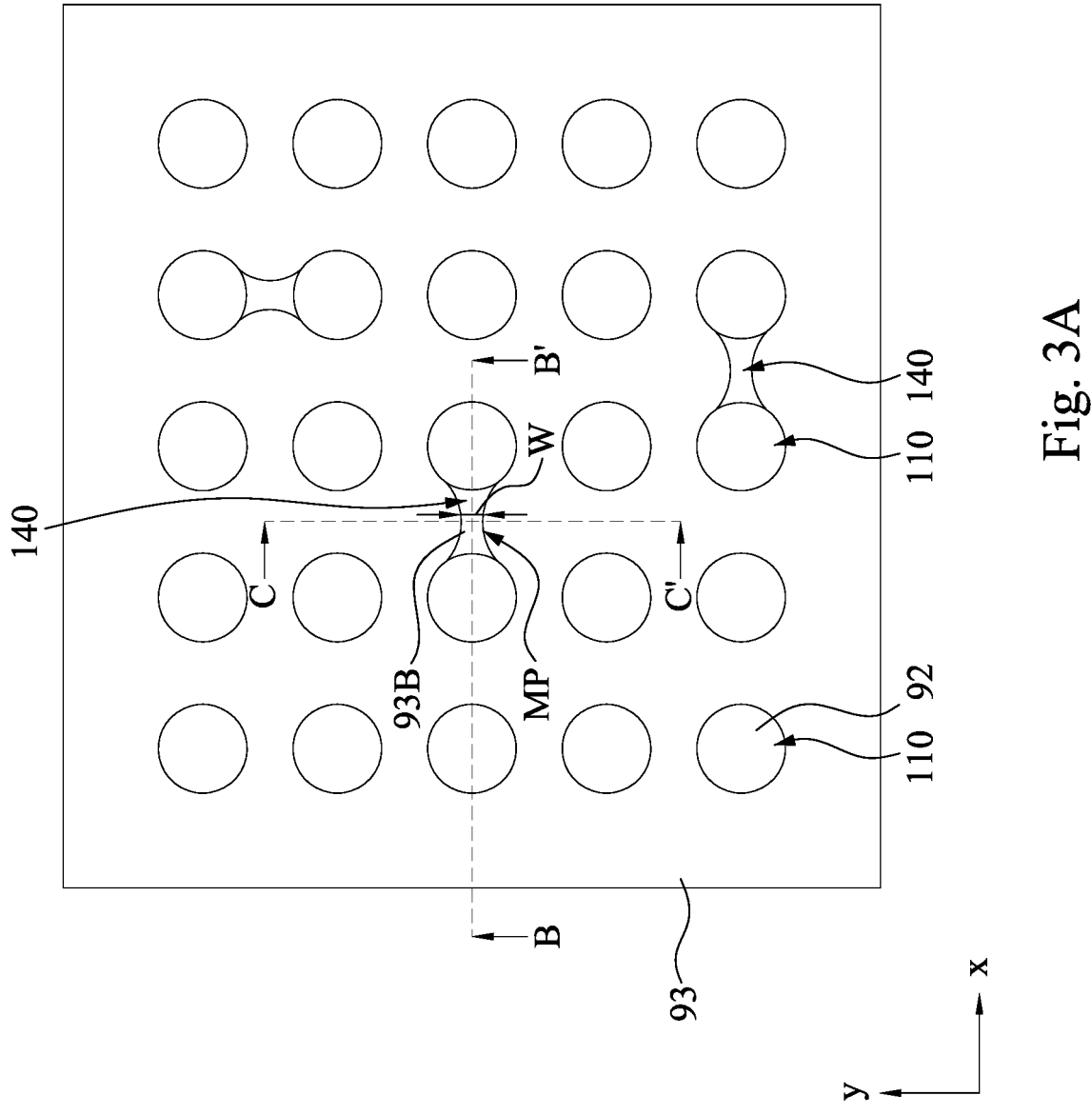
Figures 3B, 3C:
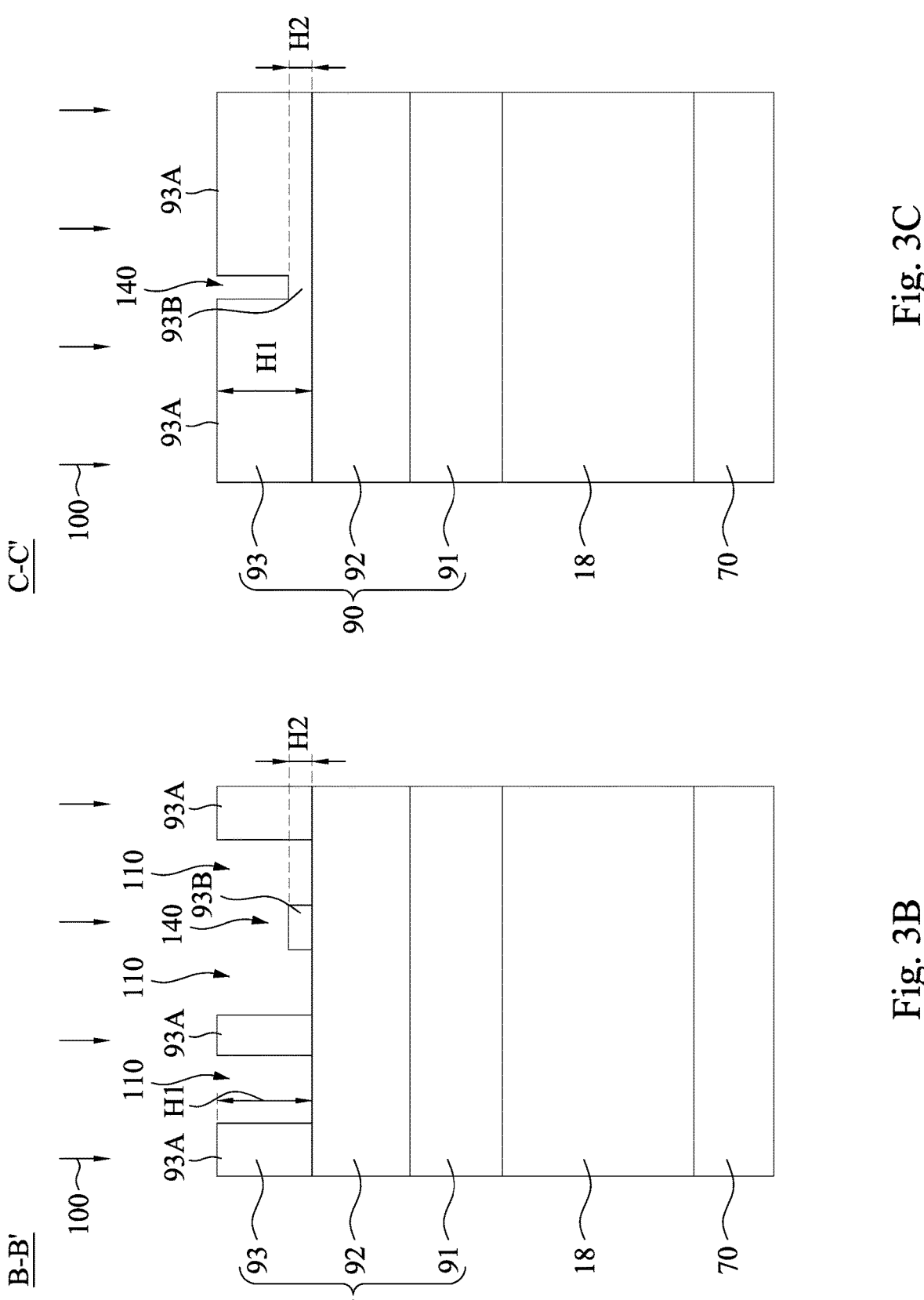

With reference to FIGS. 3A, 3B, and 3C, a photolithography process 100 is performed to the top layer 93 to form a patterned mask with a plurality of openings, trenches, and/or via holes 110 therein. However, the photolithography process 100 may consume a portion of the region 93B of the top layer 93 surrounding a corresponding one of the openings, trenches, and/or via holes 110 that is not intended to be removed, and thus the region 93B of the top layer 93 may be damaged to a thinner thickness and may not be thick enough to be a mask to have a desired pattern on the underlying middle layer 92, bottom layer 91, and the dielectric layer 18. In other words, a bridge 140 on the region 93B may be formed between corresponding adjacent two of the openings, trenches, and/or via holes 110. In some embodiments, the bridge 140 can be interchangeably referred to as a hole to hole bridge.

Specifically, the patterned top layer 93 may include regions 93A and regions 93B each between the corresponding adjacent two of the openings, trenches, and/or via holes 110, in which the regions 93B underlies the bridge 140. In some embodiments, the region 93A may have a height (i.e., vertical dimension) H1, the region 93B may have a height H2 (i.e., vertical dimension) less than the height H1 relative to the dielectric layer 18. In some embodiments, the regions 93A and the regions 93B can be interchangeably referred to as a first portion and a second portion of the top layer 93. Therefore, the first portion of the patterned top layer 93 has a lower topography than the second portion of the patterned top layer 93. As shown in FIG. 3A, the region 93B of the patterned top layer 93 has a width (i.e., a lateral dimension) W decreasing from a first one of the through holes 110 to a middle position MP of the region 93B and increasing from the middle position of the region 93B to a second one of the through holes 110.

As is illustrated, the bridge 140 may lower the height H2 of the region 93B between the corresponding adjacent two of the openings, trenches, and/or via holes 110 and communicate the adjacent openings, trenches, and/or via holes 110. As such, the presence of the bridge 140 may lead to inaccuracies or other failures in subsequent patterning processes. In some embodiments, if vias formed subsequently in the dielectric layer 18 is patterned by the top layer 93 having the bridge 140 therein, a bridge may be formed between the vias and an undesired current may occur to flow between the bridge in the dielectric layer 18, which in turn reduces the yield of the semiconductor device. In some embodiments, the bridge 140 can be interchangeably referred to as a recess. In some embodiments, the openings, trenches, and/or via holes 110 can be interchangeably referred to as through holes.

Figure 4A:
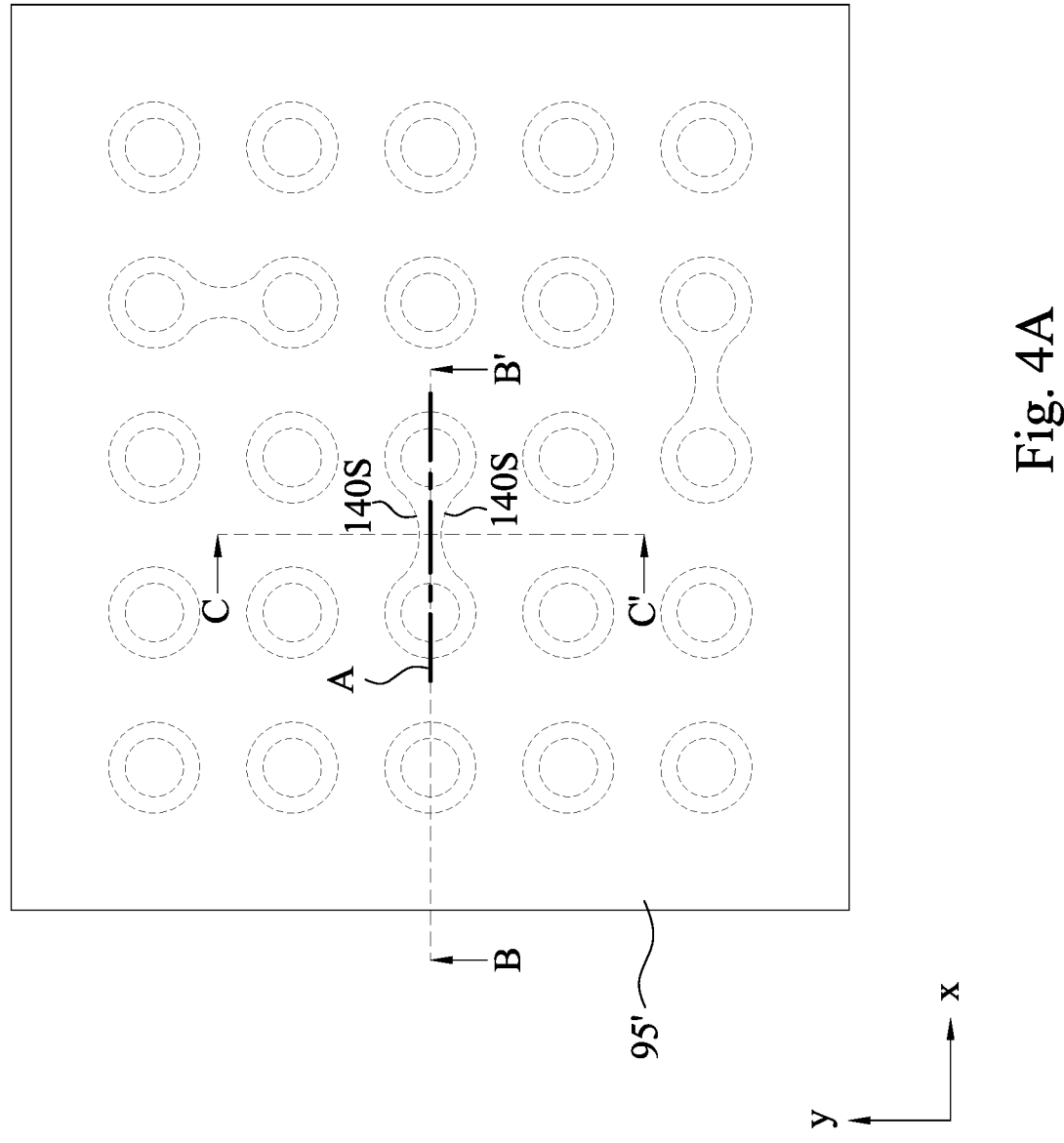
Figures 4B, 4C:
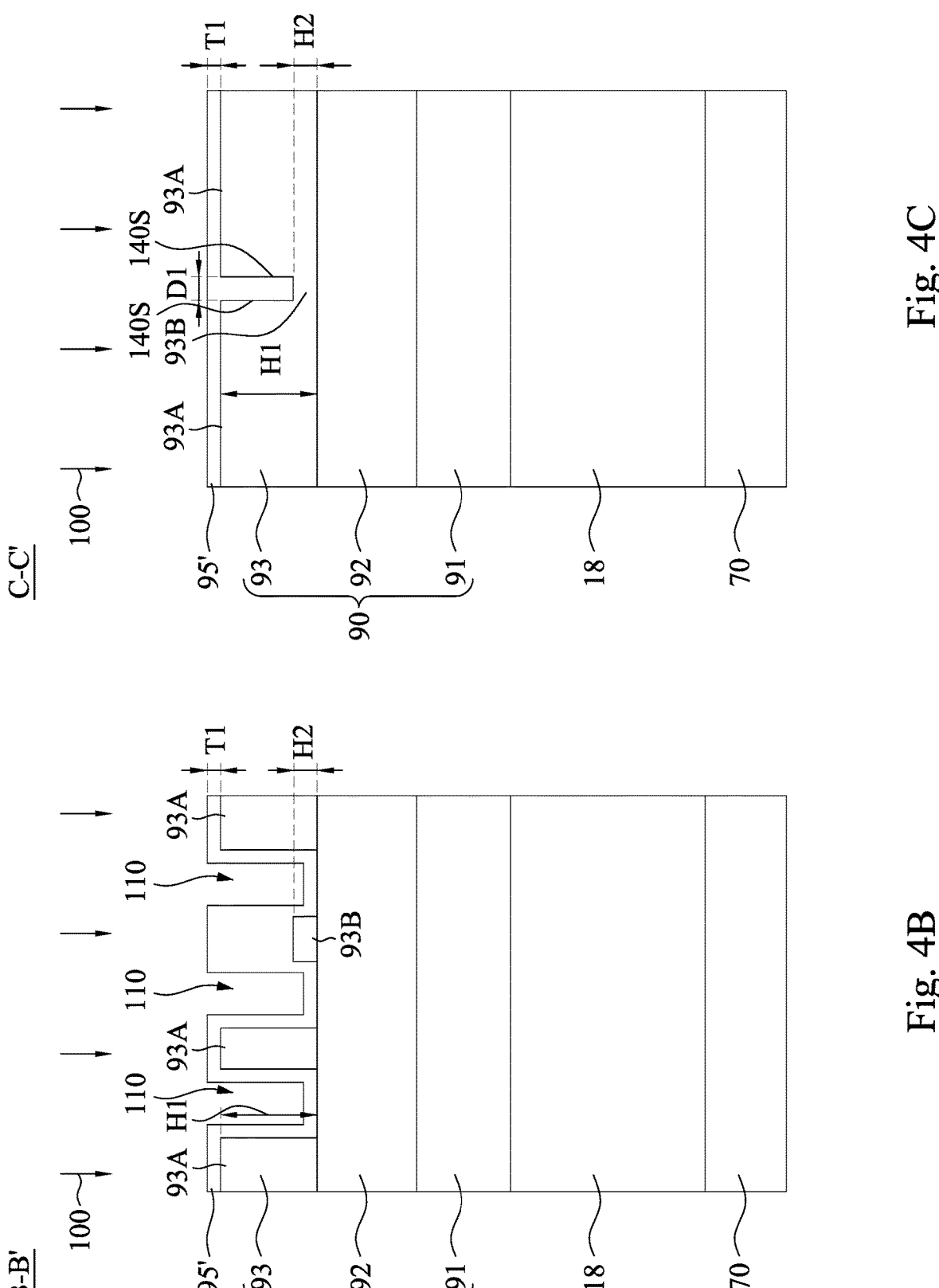

Therefore, the present disclosure in various embodiments provides a spacer merge process on the tri-layer photoresist to solve bridge issue between adjacent two openings, trenches, and/or via holes in the patterning, which in turn reduces a via hole bridge risk in the routing. With reference to FIGS. 4A, 4B, and 4C, a spacer layer 95' is blanket deposited over the structure in FIGS. 3A, 3B, and 3C (i.e., over the top layer 93 and the middle layer 92) to form on top surfaces of the top and middle layers 93 and 92 and sidewalls of the openings, trenches, and/or via holes 110 and the bridge 140. Subsequently, portions of the spacer layer 95' deposited on opposite sidewalls 140s of the bridge 140 can merges together to fill the bridge 140, which in turn interrupts the bridge 140 between the corresponding two adjacent of the openings, trenches, and/or via holes 110. Therefore, the spacer layer 95' in the bridge 140 can solve the bridge issue between corresponding adjacent two openings, trenches, and/or via holes 110 in the patterning, and thus a via hole bridge risk in the routing can be reduced. In some embodiments, the deposition of the spacer layer 95' can be interchangeably referred to as a spacer merge method. In some embodiments, the spacer layer 95' on a sidewall of the corresponding one of the openings, trenches, and/or via holes 110 may have a thickness T1 (see FIGS. 4B and 4C) thicker than half the thickness of the minimal dimension D1 (see FIG. 4C) of the bridge 140. In some embodiments, the minimal dimension D1 of the bridge 140 is perpendicular to an aligned axis A (see FIG. 4A) of the two circles openings, trenches, and/or via holes 110.

The spacer layer 95' is made of a material that has a high etching selectivity from the etching of the dielectric layer 18, the bottom layer 91, the middle layer 92, and the top layer 93. In some embodiments, the spacer layer 95' may be made of a different material than the dielectric layer 18, the bottom layer 91, the middle layer 92, and the top layer 93. In some embodiments, the spacer layer 95' may be made of a metal-containing material. For example, the spacer layer 95' may be made of titanium nitride (TiN), tungsten nitride (WN), tantalum nitride (TaN), TiAl, TiAlN, TaAl, TaAlN, TaAlC, TaCN, WNC, combinations thereof, or other suitable materials. In some embodiments, the spacer layer 95' may be made of dielectric material, such as silicon oxide (SiOx), silicon carbide (SiC), silicon nitride (SixNy), silicon carbonitride (SiCN), silicon oxycarbide (SiOC), silicon oxycarbon nitride (SiOCN), combinations thereof, or other suitable materials. In some embodiments, the spacer layer 95' may be made of a high dielectric constant (high-k) material, such as hafnium oxide (HfO$_2$), zirconium oxide (ZrO$_2$), lanthanum oxide (La$_2$O$_3$), yttrium oxide (Y$_2$O$_3$), aluminum oxide (Al$_2$O$_3$), titanium oxide (TiO$_2$), combinations thereof, or other suitable materials. In some embodiments, the spacer layer 95' may have a multilayer structure. The spacer layer can be formed using a deposition method, such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used.

Figure 5A:
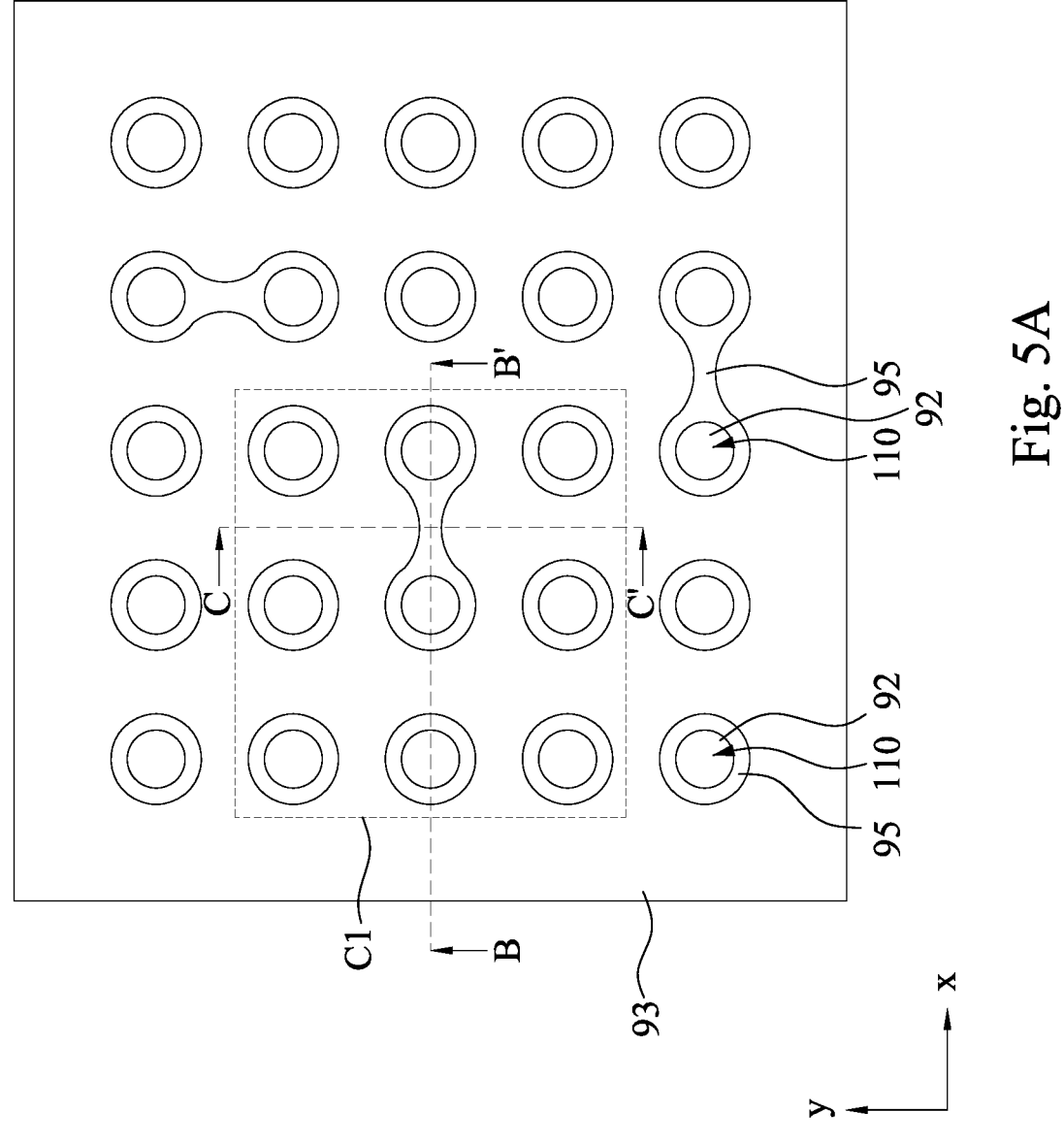
FIG. 5D illustrates a local enlarged view of a semiconductor structure according to FIG. 5A in the region C1.
FIGS. 5E, 5F, 5G, 5H, 5I, and 5J illustrate top views of different semiconductor structures corresponding to FIG. 5D in accordance with some embodiments of the present disclosure.
Figures 5B, 5C:
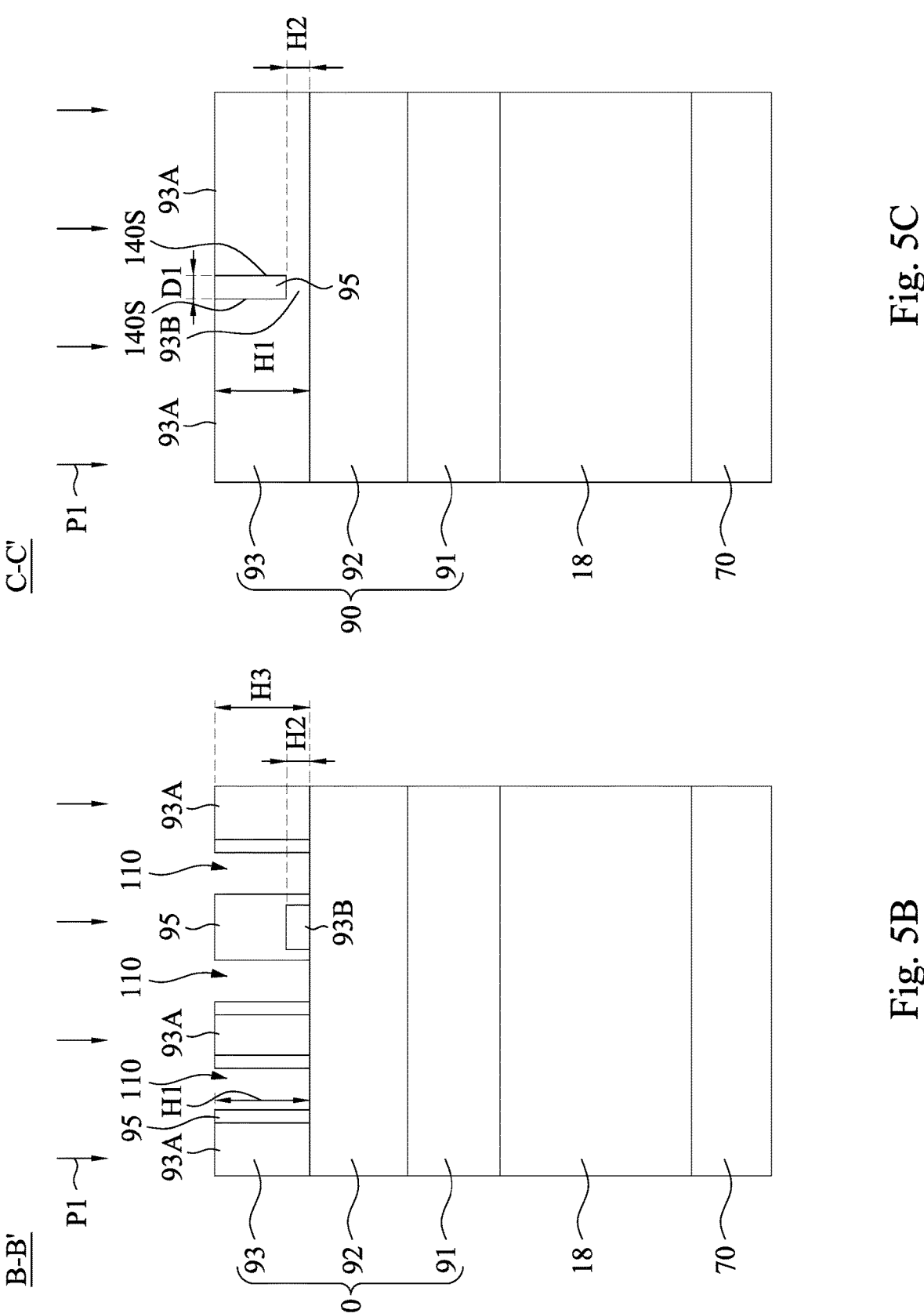

With reference to FIGS. 5A, 5B, and 5C, spacer layer 95' (see FIGS. 4B and 4C) is etched to form spacers 95. In greater detail, an anisotropic etching process P1 is performed to remove the lateral portions of the spacer layer 95'. The remaining vertical portions of the spacer layer 95' form spacers 95. The spacers 95 have a height H3 (i.e., vertical dimension) measured from the top surface of the middle 92. In some embodiments, the height H3 (see FIG. 5B) of the spacers 95 may be substantially the same as or lower than the height H1 of the region 93A of the top layer 93 due to the nature of the anisotropic etching process that selectively etches the material of spacers at a faster etch rate than it etches the top and middle layers 93 and 92. In some embodiments, the spacer 95 may have a top surface level with a top surface of the region 93A of the top layer 93. The spacers 95 are remainders of the spacer layer 95'. After the etching process P1, the spacer 95 is embedded in the bridge 140. In some embodiments, the spacer 95 is formed on a sidewall of the opening, trench, and/or via hole 110 to have a ring-shaped profile from a top view (see FIG. 5A). The height H3 of the spacers 95 depends on process conditions of the anisotropic etching process P1 (e.g., etching time duration and/or the like). In some embodiments, the etching process is performed using an isotropic etching process. In some embodiments, the etching process is performed using an anisotropic etching process. In some embodiments, the spacer 95 can be interchangeably referred to as a hard mask to pattern the underlying middle and bottom layers 92 and 91 in the subsequent process.

Figure 5F:
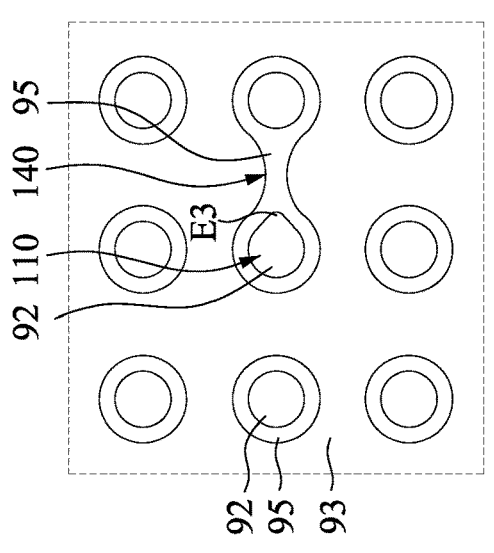
Figure 5E:
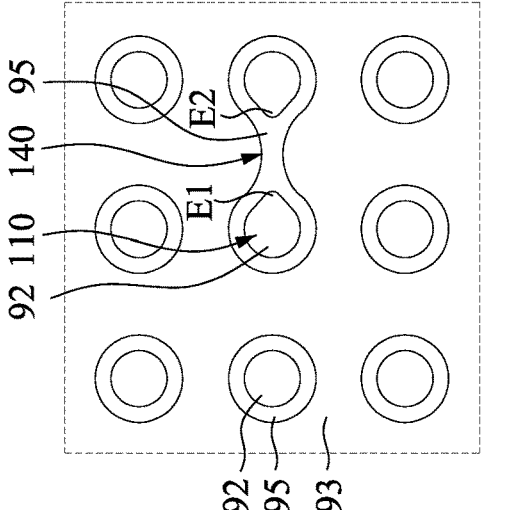
Figure 5D:
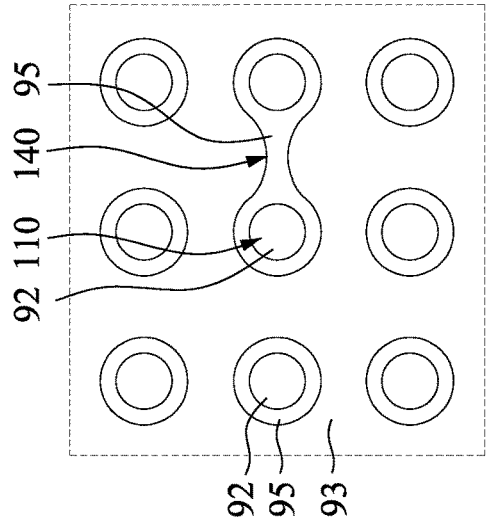
Figure 5I:
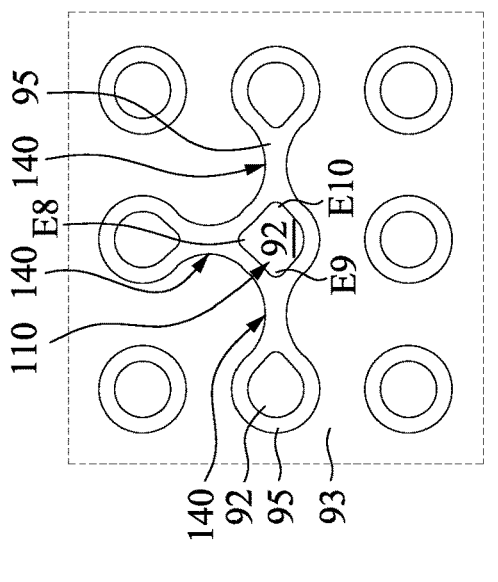
Figure 5H:
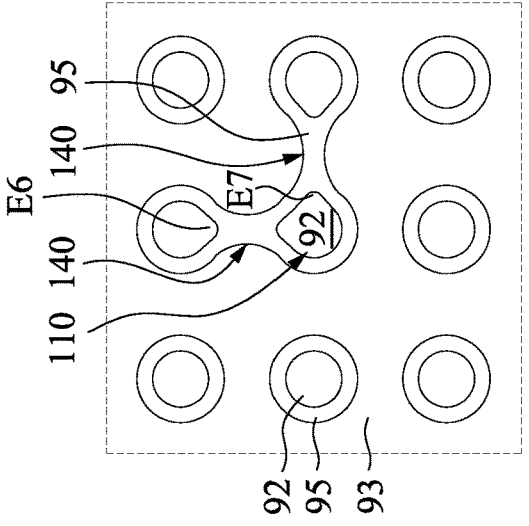
Figure 5G:
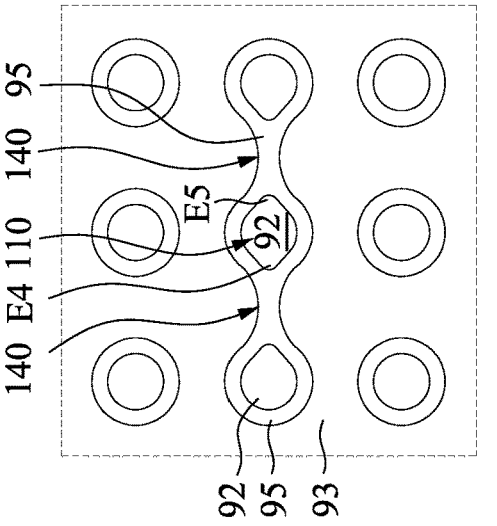
Figure 5J:
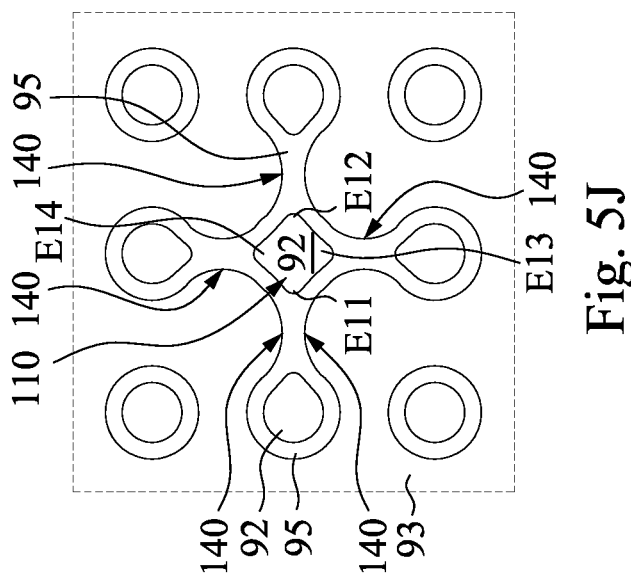

FIG. 5D illustrates a local enlarged view of a semiconductor structure according to FIG. 5A in the region C1. While FIGS. 5E-5J show other embodiments of openings, trenches, and/or via holes in the semiconductor structure having different profiles than the openings, trenches, and/or via holes 110 of semiconductor structure as shown in FIG. 5D. As shown in FIG. 5D, after the forming of the spacers 95, the spacers 95 may be formed to line sidewalls of the openings, trenches, and/or via holes 110, and remainders of the openings, trenches, and/or via holes 110 may have circular patterns from the top view. In some embodiments, after the forming of the spacers 95, remainders of corresponding ones of the openings, trenches, and/or via holes 110 adjacent to the bridge 140 may have different profiles than the circular patterns. As shown in FIG. 5E, after the forming of the spacers 95, remainders of corresponding two of the openings, trenches, and/or via holes 110 adjacent to the bridge 140 may have tip corners E1 and E2 facing toward the bridge 140. As shown in FIG. 5F, after the forming of the spacers a remainder of a corresponding one of the openings, trenches, and/or via holes 110 adjacent to the bridge 140 may have a tip corner E3, but a remainder of another one of the openings, trenches, and/or via holes 110 does not have a tip corner and have a circular pattern from the top view. As shown in FIG. 5G, after the forming of the spacers 95, a remainder of a corresponding one of the openings, trenches, and/or via holes 110 may be located between two bridges 140 and have opposite two tip corners E4 and E5 thereon from the top view. As shown in FIG. 5H, after the forming of the spacers 95, a remainder of a corresponding one of the openings, trenches, and/or via holes 110 may be located adjacent two bridges 140 and have two tip corners E6 and E7 not on opposite side thereon. As shown in FIG. 5I, after the forming of the spacers 95, a remainder of a corresponding one of the openings, trenches, and/or via holes 110 may be located adjacent three bridges 140 and have three tip corners E8, E9, E10 from the top view. As shown in FIG. 5J, after the forming of the spacers 95, a remainder of a corresponding one of the openings, trenches, and/or via holes 110 may be located adjacent among four bridges 140 and have four tip corners E11, E12, E13, E14 from the top view.

Figure 6A:
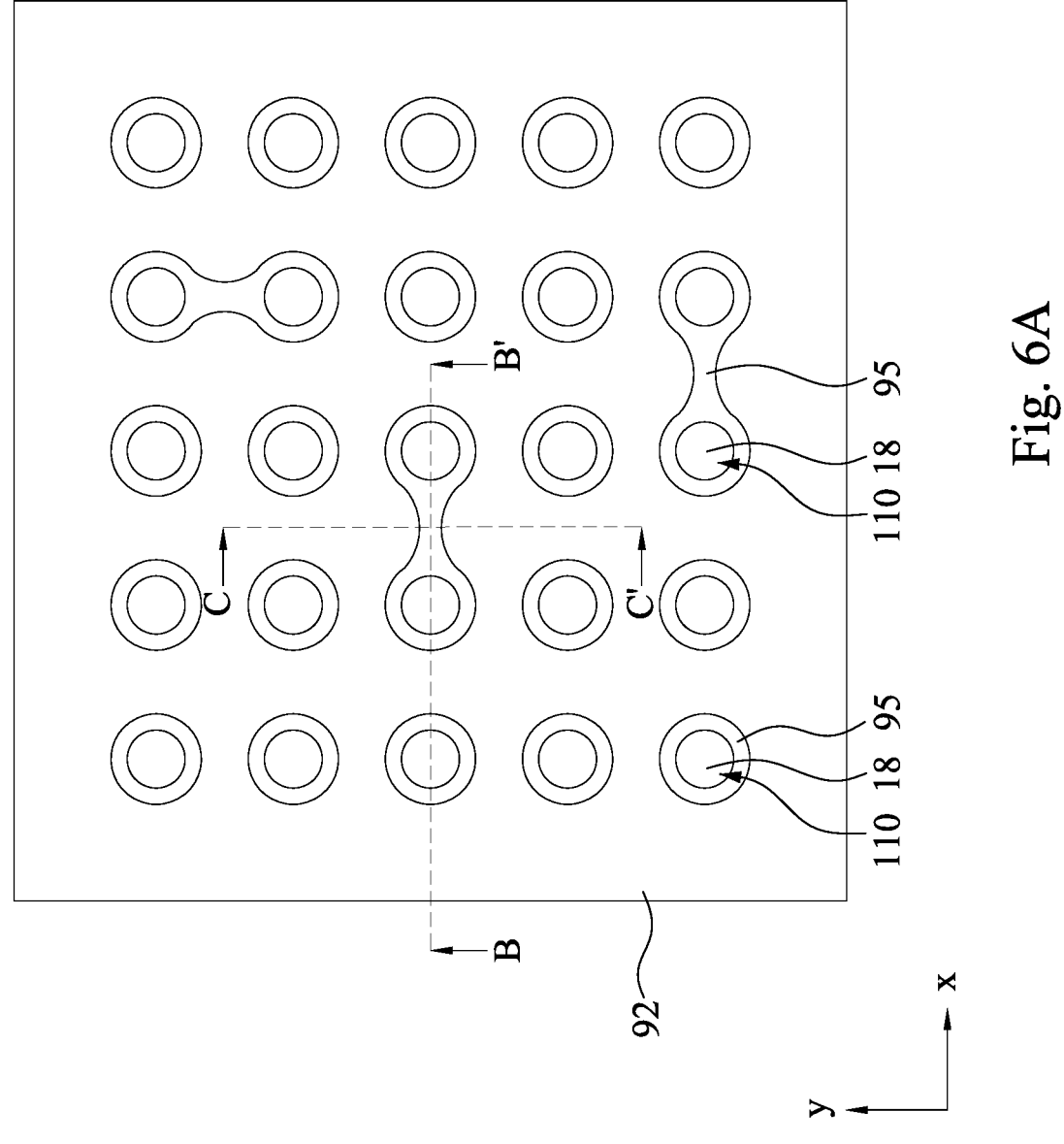
Figure 6C:
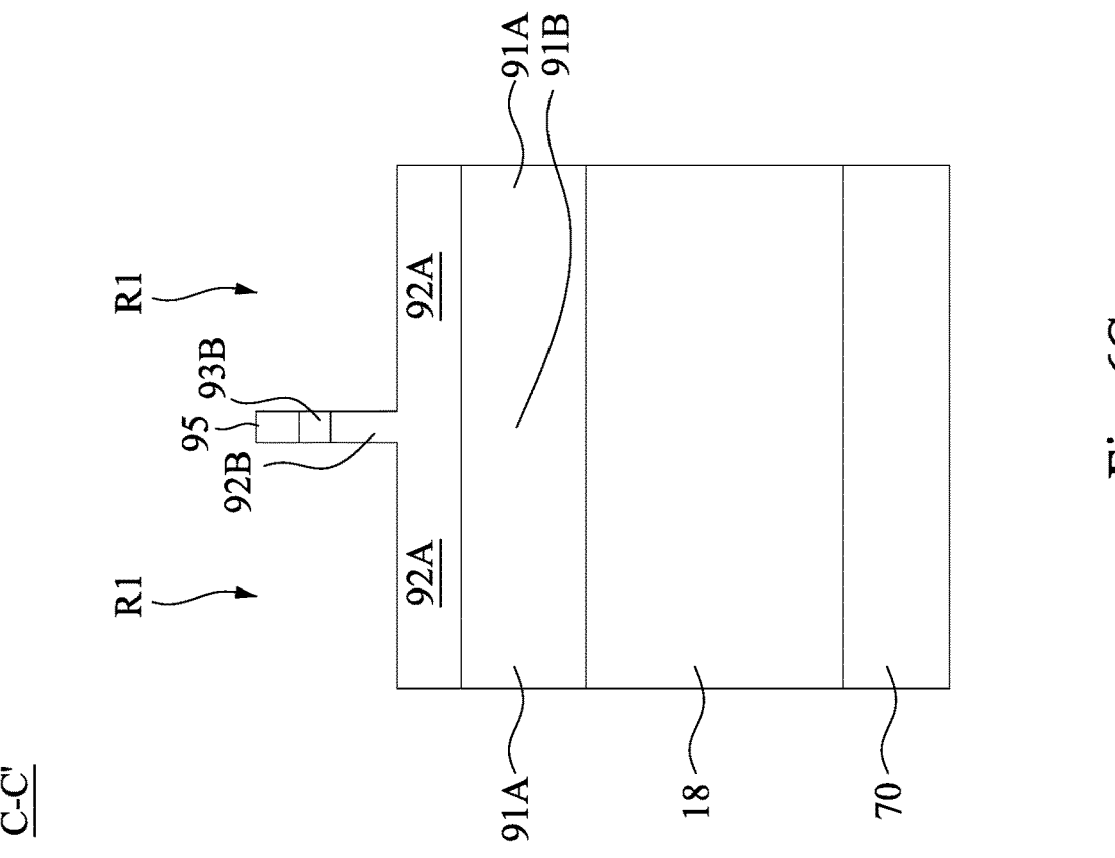
Figure 6B:
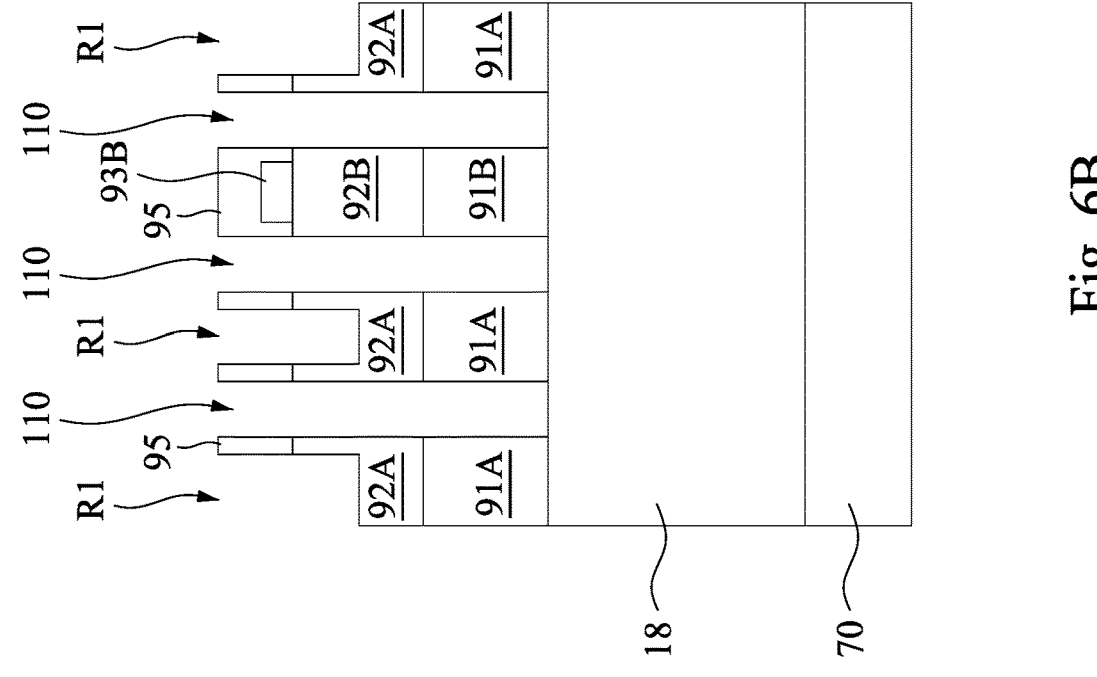

With reference to FIGS. 6A, 6B, and 6C, a first etching process is performed to "open" the middle layer 92. In other words, the middle layer 92 is patterned into regions 92A and 92B, such that the openings, trenches, and/or via holes 110 may be elongated to run through the middle layer 92. The regions 93A (see FIGS. 5B and 5C) and regions 93B may serve as a photoresist mask in the first etching process. In some embodiments, the first etching process may lead to a photoresist loss (i.e., the loss of the regions 93A). That is, the first etching process would consume the regions 93A exposed form the spacers 95, and thus regions 93A may be damaged as shown in FIGS. 6B and 6C. The spacer 95 around the region 93B of the top layer 93 can prevent the over-etching of the region 93B by protecting them while the middle layer 92 is being etched. As such, the first etching process can only minimally react with the region 93B that has a shorter height than the region 93B which in turn prevents the metal via (see FIG. 10A) from occurring bridge issue. On the other hand, the lack of protection for the photoresist often leads to over-etching of the photoresist, where the photoresist may suffer greater-than-expected height loss. In some cases, portions of the photoresist may be etched away in its entirety. In either of these scenarios, the over-etched photoresist cannot be properly used to carry out etching of the middle layer, as that would likely result in bridge issues. For example, a region of the middle layer that should not have been etched is now etched due to the insufficient photoresist. Consequently, semiconductor device performance may be degraded, and device failures may increase. As a result of the first etching process, the middle layer 92 is patterned into regions 92A and 92B. The regions 92A and 92B align with the regions 93A and 93B, respectively, since the regions 93A and 93B may serve as a mask during the first etching process. In some embodiments, the regions 92A and the regions 92B can be interchangeably referred to as first and second portions of the middle layer 92.

In some embodiments, an etch rate of the spacer 95 is lower than an etch rate of the middle layer 92 during the first etching process. In some embodiments, an etch rate of the spacer 95 is lower than the etch rate of the top layer 93 during the first etching process. In some embodiments, an etch rate of the top layer 93 is lower than the etch rate of the middle layer 92 during the first etching process. By way of example but not limiting the present disclosure, a ratio of the etch rate of the middle layer 92 to the etch rate of the spacer 95 may be greater than about 5, such as about 5, 6, 7, 8, 9, or 10, during the first etching process. A ratio of the etch rate of the top layer 93 to the etch rate of the spacer 95 may be greater than about 5, such as about 5, 6, 7, 8, 9, or 10, during the first etching process. A ratio of the etch rate of the middle layer 92 to the etch rate of the top layer 93 may be greater than about 5, such as about 5, 6, 7, 8, 9, or 10, during the first etching process.

In some embodiments, the first etching process may be a plasma etching process, for example the ICP process. In some embodiments, an etching gas of the first etching process may include oxygen gas ($O_2$), carbon dioxide ($CO_2$) or other suitable etching gas. In some embodiments, an etching gas of the first etching process may include fluorine-containing gas, such as nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluoro-cyclobutane ($C_4F_8$), combinations thereof, or other suitable etching gas. In some embodiments, an etching gas of the first etching process may include $H_2$, $N_2$, and Ar. In some embodiments, the $CHF_3$ gas may serve as a main gas, and the $N_2$ and Ar gases may serve as assistant gases during the first etching process. It is also understood that in alternative embodiments, other suitable gases may be used as a main gas instead of the $CHF_3$ gas.

Subsequently, a second etching process is performed to "open" the bottom layer 91, such that the openings, trenches, and/or via holes 110 may be elongated to run through the bottom layer 91. In other words, the bottom layer 91 is patterned into regions 91A and 91B. The regions 92A and 92B of the patterned middle layer 92 may serve as a mask in the second etching process. In some embodiments, the second etching process may lead to a photoresist loss (i.e., the loss of the regions 92A). That is, the second etching process would consume the regions 92A exposed form the spacers and thus the regions 92A may be damaged as shown in FIGS. 6B and 6C. In some embodiments, when the first and second etching processes are complete, the regions 93A are completely consumed, and the regions 93A is remained under the spacer 95. The recesses R1 are formed in the regions 92A. The spacer 95 around the region 93B of the top layer 93 can prevent the over-etching of the region 92B undying the region 93B by protecting them while the bottom layer 91 is being etched. As such, the second etching process can only minimally react with the region 92B undying the region 93B having a shorter height than the region 93B which in turn prevents the metal via (see FIG. 10A) from occurring bridge issue. As a result of the second etching process, the bottom layer 91 is patterned into regions 91A and 91B. The regions 91A and 91B align with the regions 92A and 92B, respectively, since the regions 92A and 92B may serve as a mask during the second etching process. In some embodiments, the regions 91A and the regions 91B can be interchangeably referred to as first and second portions of the bottom layer 91.

In some embodiments, an etch rate of the spacer 95 is lower than an etch rate of the middle layer 91 during the second etching process. In some embodiments, an etch rate of the spacer 95 is lower than the etch rate of the middle layer 92 during the second etching process. In some embodiments, an etch rate of the middle layer 92 is lower than the etch rate of the bottom layer 91 during the second etching process. By way of example but not limiting the present disclosure, a ratio of the etch rate of the bottom layer 91 to the etch rate of the spacer 95 may be greater than about 5, such as about 5, 6, 7, 8, 9, or 10, during the second etching process. A ratio of the etch rate of the middle layer 92 to the etch rate of the spacer 95 may be greater than about 5, such as about 5, 6, 7, 8, 9, or 10, during the second etching process. A ratio of the etch rate of the bottom layer 91 to the etch rate of the middle layer 92 may be greater than about 5, such as about 5, 6, 7, 8, 9, or 10, during the second etching process.

In some embodiments, the second etching process may be a plasma etching process, for example the ICP process. In some embodiments, the first and second etching processes may be in-situ performed. In some embodiments, the first and second etching processes may be ex-situ performed. In some embodiments, the second etching process may include a same etching gas as the first etching process. In some embodiments, the second etching process may include a different etching gas than the first etching process. In some embodiments, an etching gas of the second etching process may include oxygen gas ($O_2$), carbon dioxide ($CO_2$) or other suitable etching gas. In some embodiments, an etching gas of the second etching process may include fluorine-containing gas, such as nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), combinations thereof, or other suitable etching gas. In some embodiments, an etching gas of the second etching process may include $H_2$, $N_2$, and Ar. In some embodiments, the $CHF_3$ gas may serve as a main gas, and the $N_2$ and Ar gases may serve as assistant gases during the second etching process. It is also understood that in alternative embodiments, other suitable gases may be used as a main gas instead of the $CHF_3$ gas.

Figure 7A:
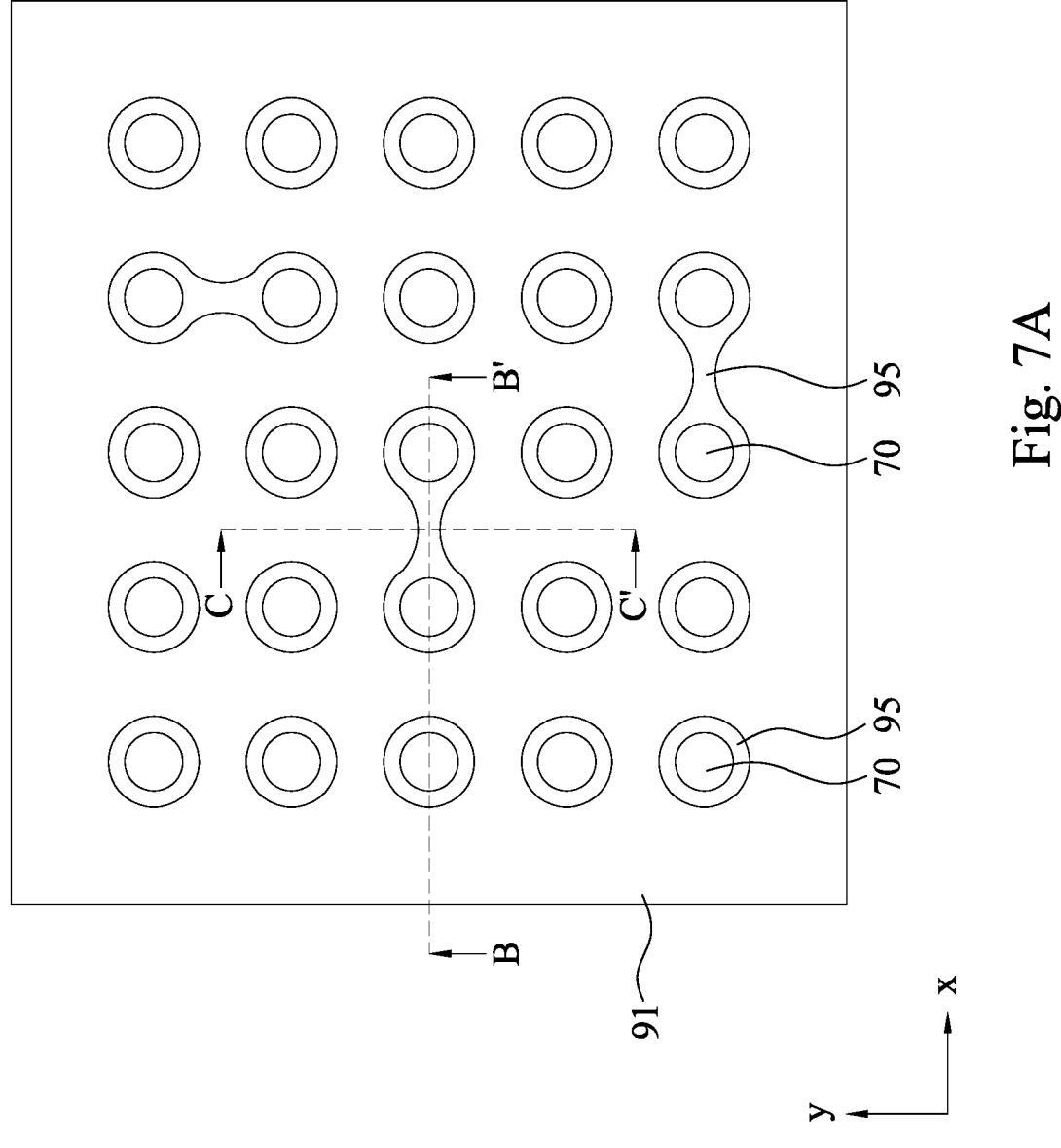
Figure 7C:
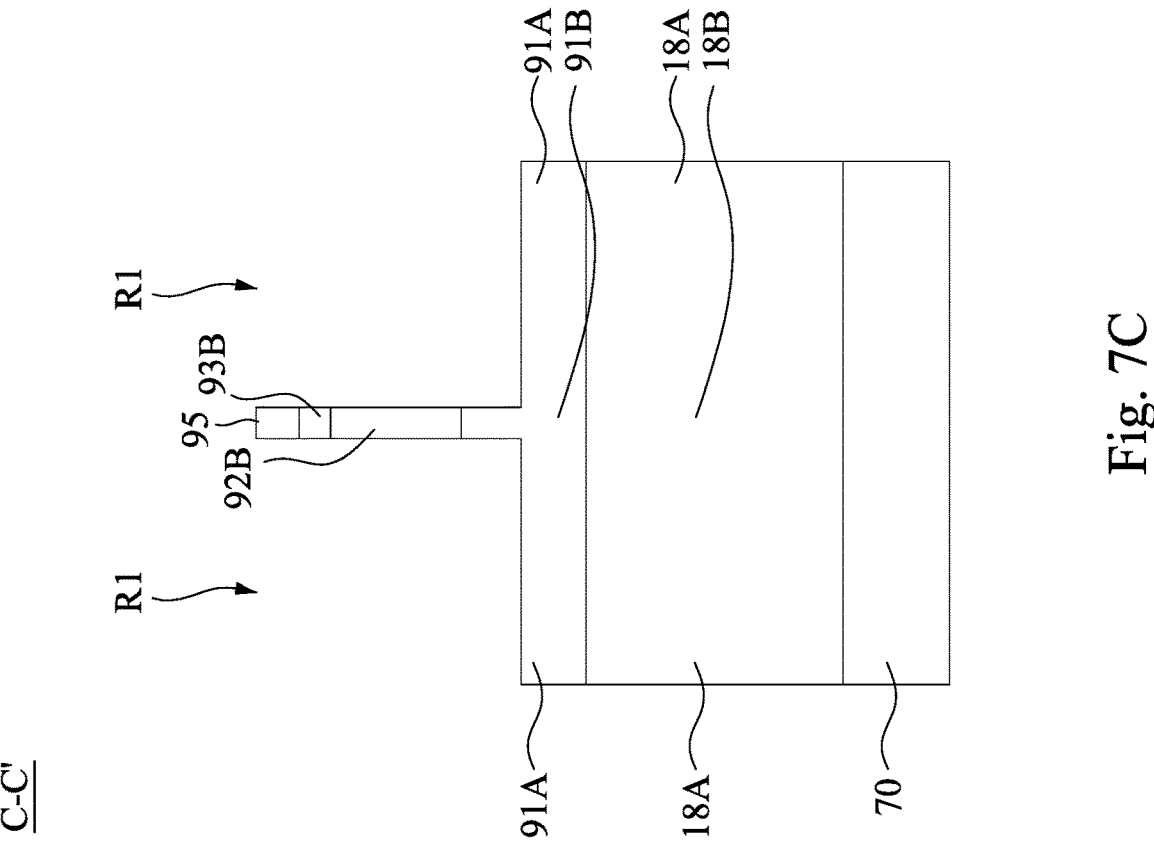
Figure 7B:
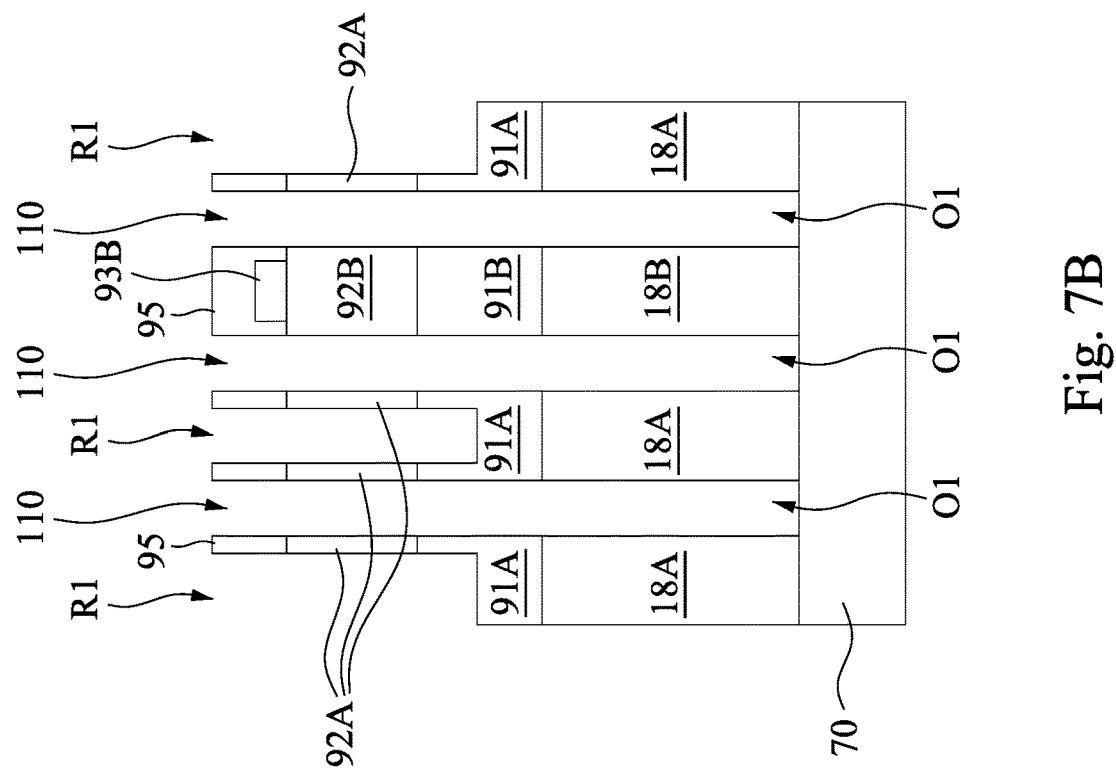

With reference to FIGS. 7A, 7B, and 7C, a third etching process is performed to pattern the dielectric layer 18. The dielectric layer 18 is patterned into regions 18A and 18B and has a plurality of openings O1 (see FIG. 7B) therein. In some embodiments, the opening O1 can be interchangeably referred to as a via hole. The regions 91A and 91B of the patterned bottom layer may serve as a mask in the third etching process. In some embodiments, the third etching process may lead to a photoresist loss (i.e., the loss of the regions 91A). That is, the third etching process would consume the regions 91A exposed form the spacers 95, and thus the regions 91A may be damaged as shown in FIGS. 7B and 7C. In some embodiments, when the third etching process is complete, the recesses R1 may be elongated to run through the regions 92A and regions 93A and be formed in the regions 91A. The spacer 95 remains covering the region 93B of the top layer 93. The spacer 95 around the region 93B of the top layer 93 can prevent the over-etching of the region 91B undying the region 93B by protecting them while the dielectric layer 18 is being etched. As such, the third etching process can only minimally react with the region 91B undying the region 93B having a shorter height than the region 93B which in turn prevents the metal via (see FIG. 10A) from occurring bridge issue. As a result of the third etching process, the dielectric layer 18 is patterned into regions 18A and 18B. The regions 18A and 18B align with the regions 91A and 91B, respectively, since the regions 91A and 91B may serve as a mask during the third etching process. As a result of these etching processes, various semiconductor features such as trenches, islands, or via may be formed in the dielectric layer 18. In some embodiments, the regions 18A and the regions 18B can be interchangeably referred to as first and second portions of the dielectric layer 18.

In some embodiments, an etch rate of the spacer 95 is lower than an etch rate of the dielectric layer 18 during the third etching process. In some embodiments, an etch rate of the spacer 95 is lower than the etch rate of the bottom layer 91 during the third etching process. In some embodiments, an etch rate of the bottom layer 91 is lower than the etch rate of the dielectric layer 18 during the third etching process. By way of example but not limiting the present disclosure, a ratio of the etch rate of the dielectric layer 18 to the etch rate of the spacer 95 may be greater than about 5, such as about 5, 6, 7, 8, 9, or 10, during the third etching process. A ratio of the etch rate of the bottom layer 91 to the etch rate of the spacer 95 may be greater than about 5, such as about 5, 6, 7, 8, 9, or 10, during the third etching process. A ratio of the etch rate of the dielectric layer 18 to the etch rate of the bottom layer 91 may be greater than about 5, such as about 5, 6, 7, 8, 9, or 10, during the third etching process.

In some embodiments, the third etching process may be a plasma etching process, for example the ICP process. In some embodiments, the second and third etching processes may be in-situ performed. In some embodiments, the second and third etching processes may be ex-situ performed. In some embodiments, the third etching process may include a same etching gas as the second etching process. In some embodiments, the third etching process may include a different etching gas than the second etching process. In some embodiments, an etching gas of the third etching process may include oxygen gas ($O_2$), carbon dioxide ($CO_2$) or other suitable etching gas. In some embodiments, an etching gas of the third etching process may include fluorine-containing gas, such as nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), combinations thereof, or other suitable etching gas. In some embodiments, an etching gas of the third etching process may include $H_2$, $N_2$, and Ar. In some embodiments, the $CHF_3$ gas may serve as a main gas, and the $N_2$ and Ar gases may serve as assistant gases during the third etching process. It is also understood that in alternative embodiments, other suitable gases may be used as a main gas instead of the $CHF_3$ gas.

Figure 8A:
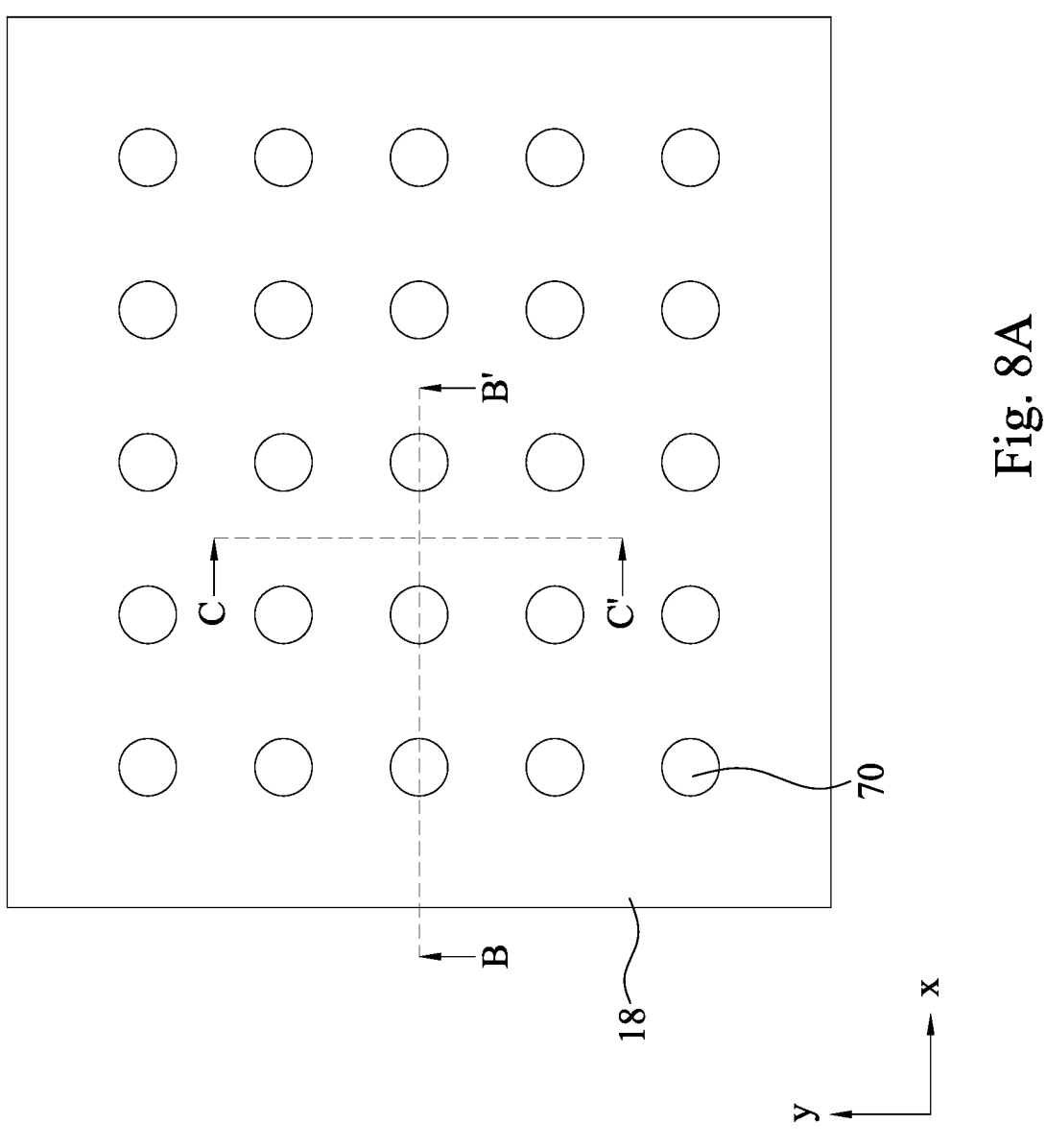
Figure 8C:
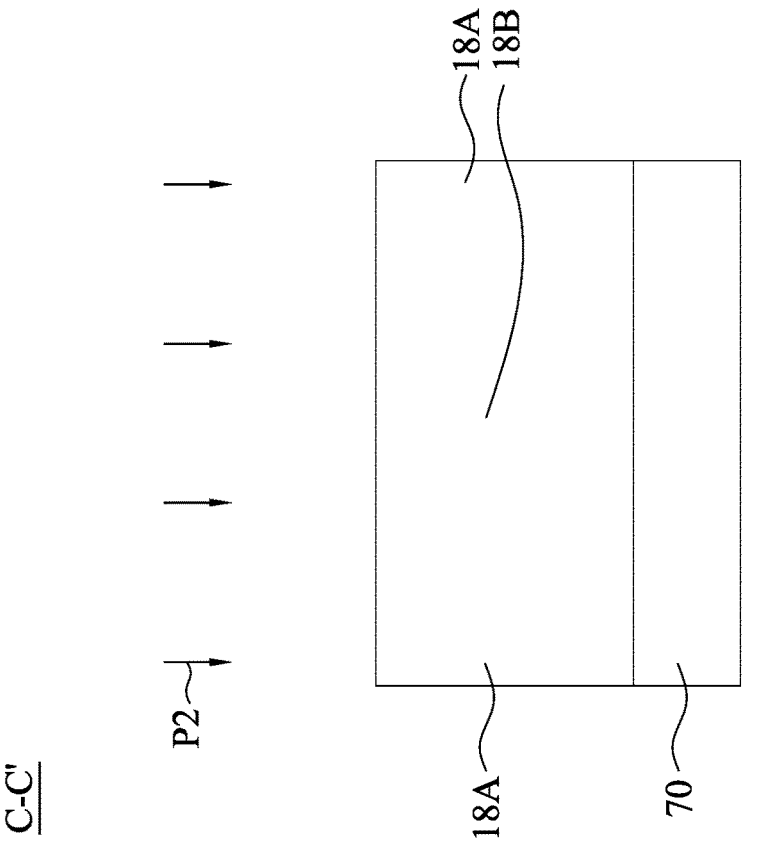
Figure 8B:
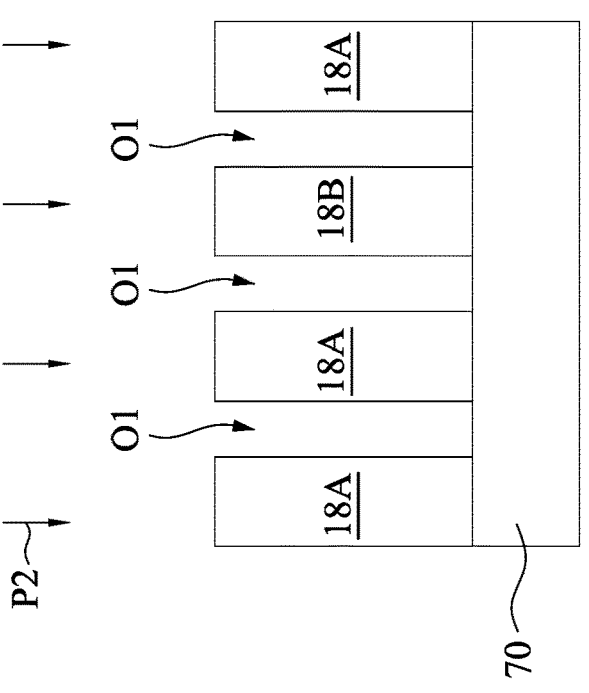

With reference to FIGS. 8A, 8B, and 8C, the tri-layer photoresist 90 and the spacer 95 can be by a removal process P2 to expose the patterned dielectric layer 18. In some embodiments, the removal process P2 may be an ashing process. In some embodiments, tri-layer photoresist 90 and the spacer 95 may be removed by dry etching, wet etching, or a combination of dry and wet etching. By way of example and not limitation, the ashing processes may be a plasma process that form a plasma having a monatomic reactive species (e.g., such as oxygen or fluorine), which combines with the tri-layer photoresist 90 and the spacer 95 to form an ash that is evacuated from a processing chamber.

Figure 9A:
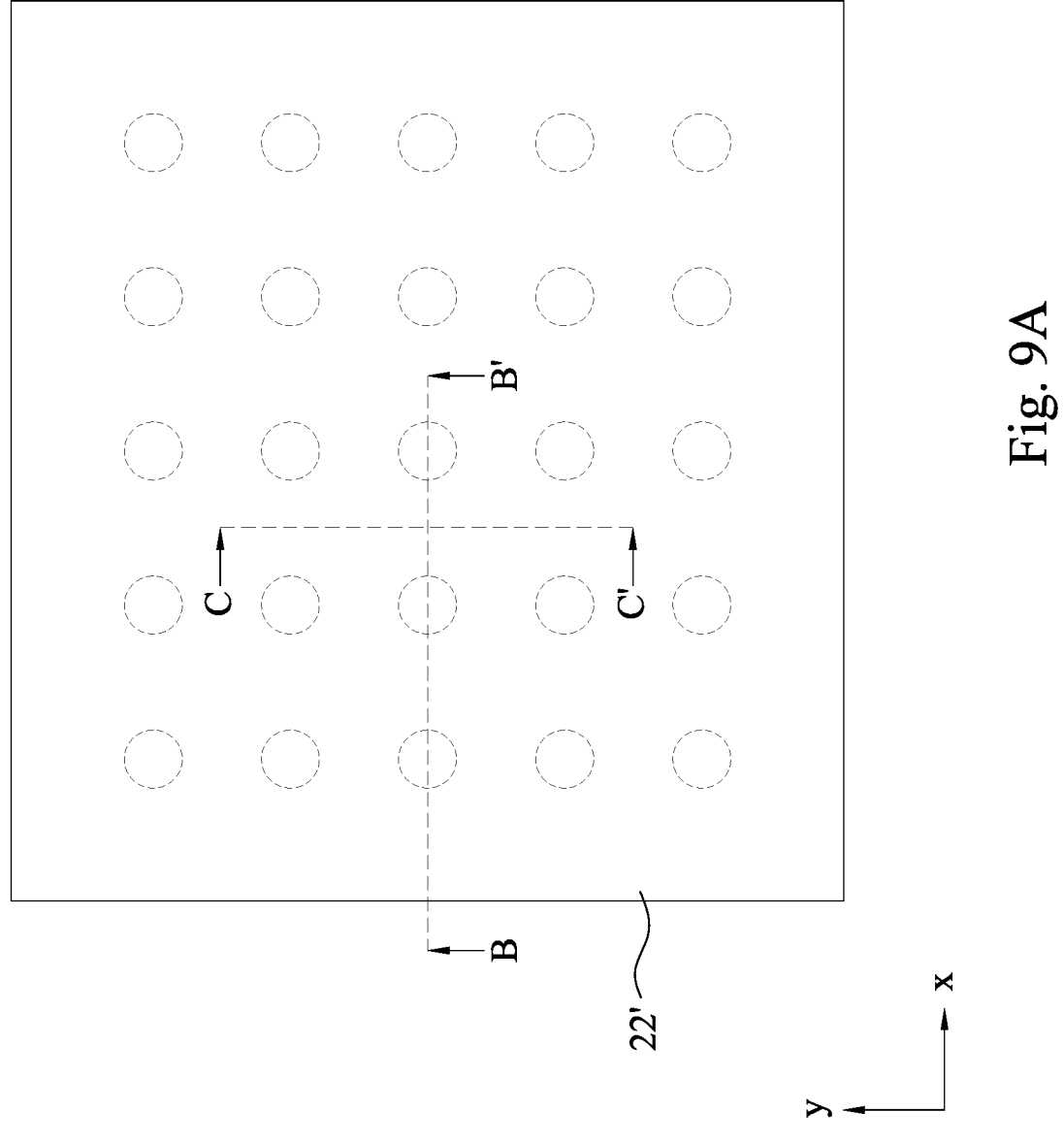
Figure 9C:
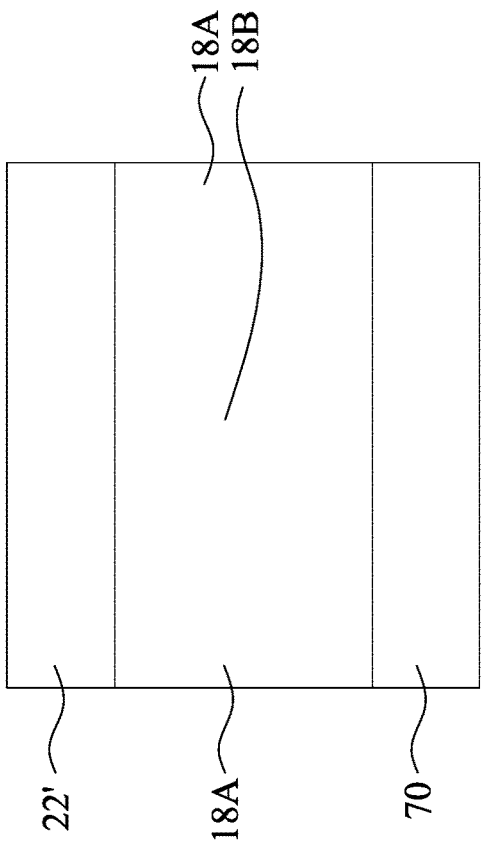
Figure 9B:
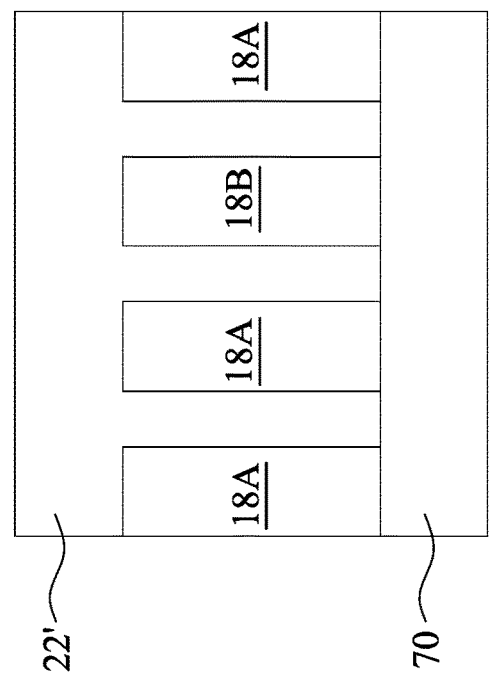

With reference to FIGS. 9A, 9B, and 9C, a conductive material 22' is deposited over the dielectric layer 18 and fills in the openings O1. The conductive material 22' includes, for example, Cu, Al, W, Co, Ru, or other suitable metals. In some embodiments, the method of forming the conductive material 22' may include CVD, PVD, ALD, or other suitable processes. In some embodiments, the conductive material 22' be made of a different material than the spacer layer 95' as shown in FIGS. 4A, 4B, and 4C.

Figure 10A:
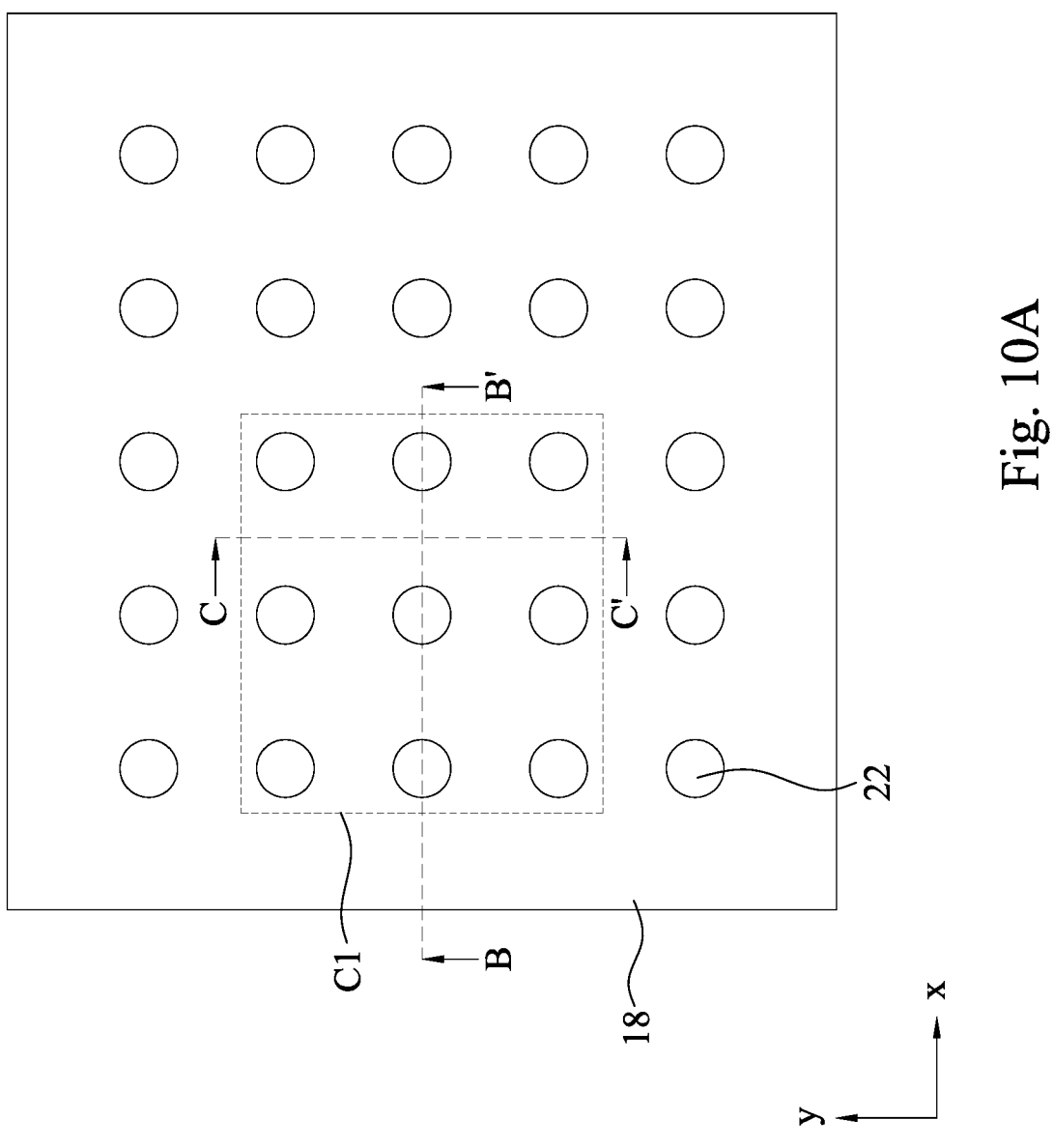
FIG. 10D illustrates a local enlarged view of a semiconductor structure according to FIG. 10A in the region C1.
FIGS. 10E, 10F, 10G, 10H, 10I, and 10J illustrate top views of different semiconductor structures corresponding to FIG. 10D in accordance with some embodiments of the present disclosure.
Figure 10C:
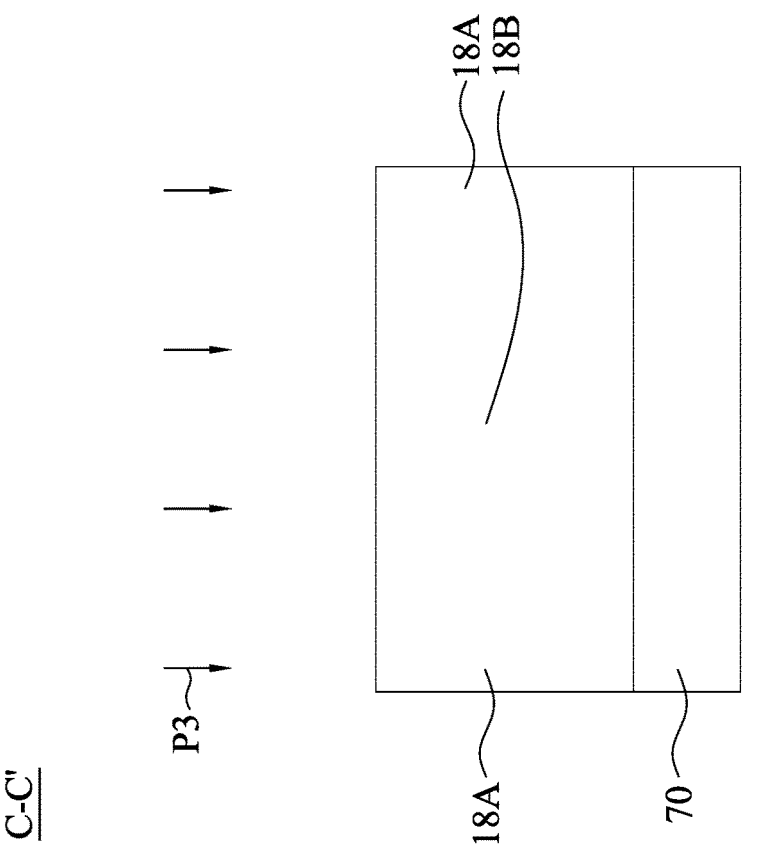
Figure 10B:
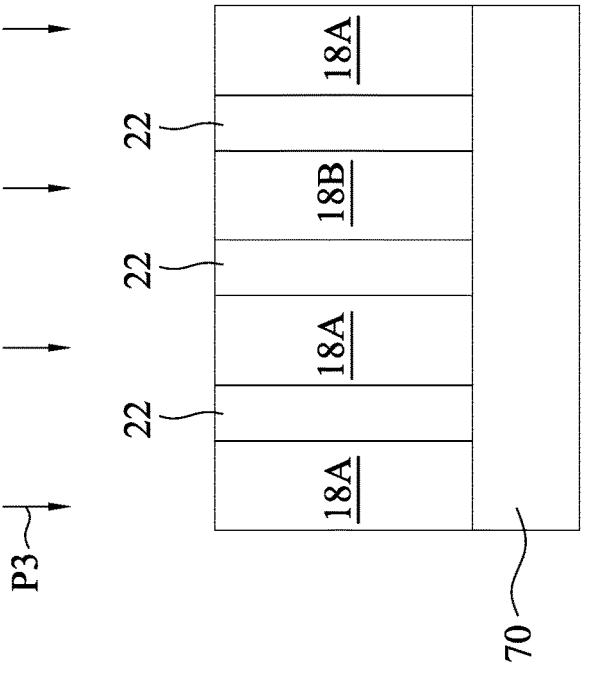

With reference to FIGS. 10A, 10B, and 10C, the excess portions of the conductive material 22' (see FIGS. 9B and 9C) are removed through a removal process P3, such as chemical mechanical polishing (CMP), or the like, forming the upper surface of the metal-filled opening substantially coplanar with a top surface of the dielectric layer 18. The remaining portions of the conductive material 22' (see FIGS. 9B and 9C) in the opening O1 forms the metal features 22, such as metal vias.

Figure 10F:
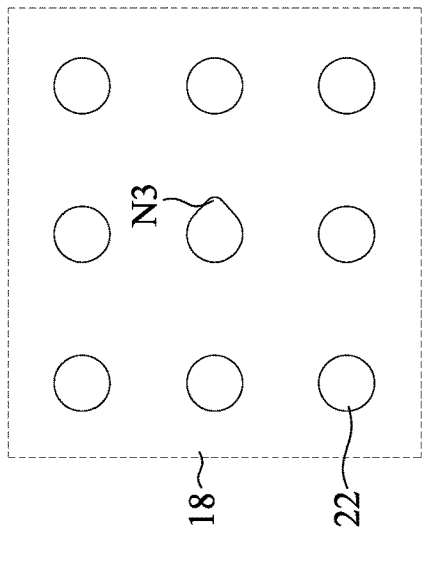
Figure 10E:
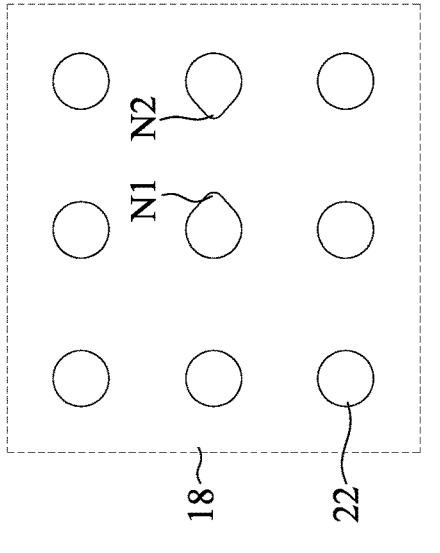
Figure 10D:
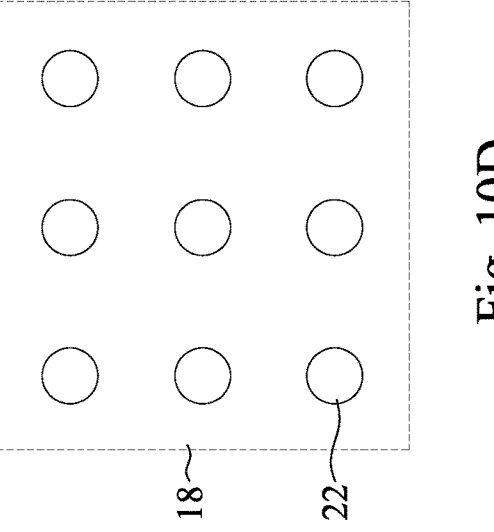

FIG. 10D illustrates a local enlarged view of a semiconductor structure according to FIG. 10A in the region C1. FIGS. 10E-10J illustrate intermediate stages in the formation of metal features of interconnect structure in a semiconductor structure corresponding to FIGS. 5E-5J. While FIGS. 10E-10J show other embodiments of metal features in the semiconductor structure having different profiles than the metal vias 22 in semiconductor structure as shown in FIG. 10D. As shown in FIG. 10D, after the removal process P3, the metal vias 22 may be formed to have circular patterns from the top view. In some embodiments, after the removal process P3, corresponding ones of the metal vias 22 adjacent to the bridge 140 may have different profiles than the circular patterns. As shown in FIG. 10E, after the removal process P3, corresponding two of the metal vias 22 may have tip corners N1 and N2 facing toward each other. The tip corner N1 of a first one of the metal vias 22 points to a second one of the metal vias 22 from the top view, and the tip corner N2 of the second one of the metal vias 22 points to the first one of the metal vias 22 from the top view.

Figure 10I:
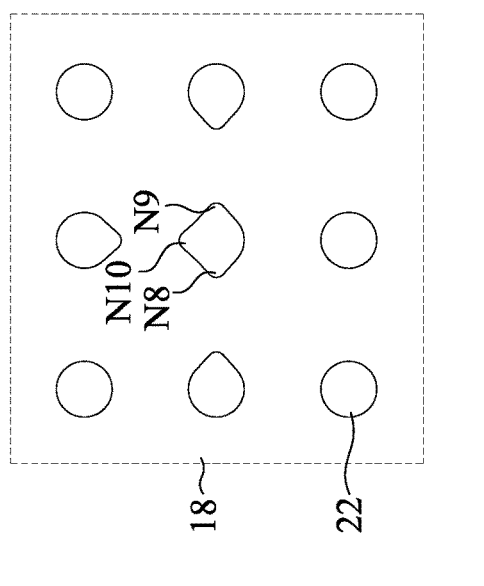
Figure 10H:
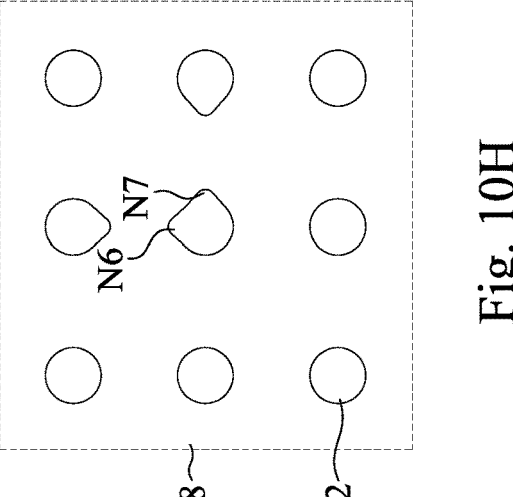
Figure 10G:
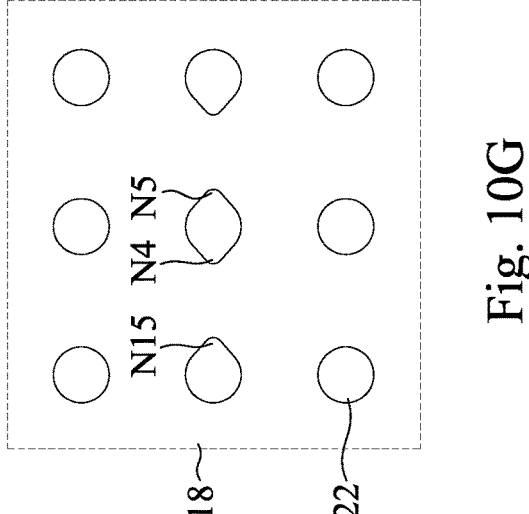
Figure 10J:
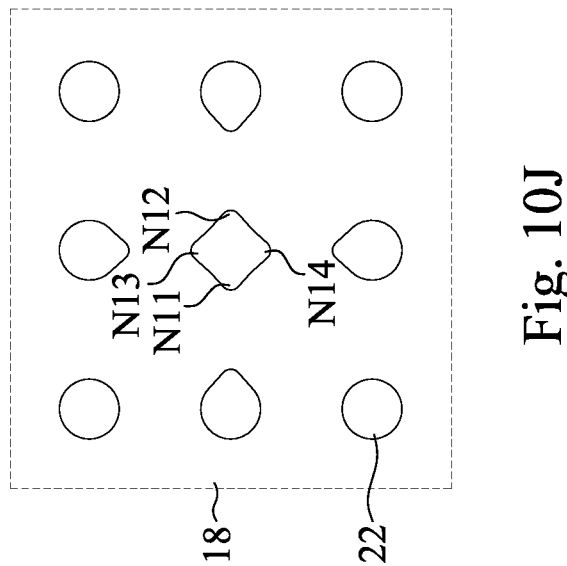

As shown in FIG. 10F, after the removal process P3, a corresponding one of the metal vias 22 may have a tip corner N3, others surround the said corresponding one do not have a tip corner and have circular patterns from the top view. As shown in FIG. 10G, after the removal process P3, a corresponding one of the metal vias 22 may have opposite two tip corners N4 and N5 thereon from the top view, and another corresponding one of the metal vias 22 may have a tip corner N15 facing toward the tip corner N4. As shown in FIG. 10H, after the removal process P3, a corresponding one of the metal vias 22 may have two tip corners N6 and N7 not on opposite side thereon from the top view. As shown in FIG. 10I, after the removal process P3, a corresponding one of the metal vias 22 may have three tip corners N8, N9, N10 thereon from the top view. As shown in FIG. 10J, after the removal process P3, a corresponding one of the metal vias 22 may have four tip corners N11, N12, N13, N14 thereon from the top view.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a spacer merge process performed on the tri-layer photoresist to solve bridge issue between adjacent two openings, trenches, and/or via holes in the patterning, which in turn reduces a via hole bridge risk in the routing.

In some embodiments, a method includes depositing a dielectric layer over a semiconductor substrate; forming a first photoresist layer over the dielectric layer; patterning the first photoresist layer to form through holes, such that a first portion of the first photoresist layer between a first one and a second one of the through holes has a less height than a second portion of the first photoresist layer between the first one and a third one of the through holes; forming a spacer on the first portion of the first photoresist layer; performing an etching process on the dielectric layer to form via holes while the spacer remains covering the first portion of the first photoresist layer; forming a plurality of metal vias in the via holes. In some embodiments, from a top view, the first portion of the first photoresist layer has a width decreasing from the first one of the through holes to a middle position of the first portion of the first photoresist layer and increasing from the middle position of the first portion of the first photoresist layer to the second one of the through holes. In some embodiments, the spacer is further formed on a sidewall of the first one of the through holes. In some embodiments, the spacer has a top surface level with a top surface of the second portion of the patterned first photoresist layer. In some embodiments, the spacer is made of a different material than the first photoresist layer. In some embodiments, the spacer is made of a different material than the dielectric layer. In some embodiments, the etching process also consumes the second portion of the first photoresist layer. In some embodiments, the etching process etches the dielectric layer at a faster etch rate than it etches the spacer. In some embodiments, the method further includes forming a second photoresist layer on the dielectric layer prior to forming the first photoresist layer. In some embodiments, the method further includes forming a third photoresist layer on the dielectric layer prior to forming the second photoresist layer.

In some embodiments, a method includes depositing a dielectric layer over a substrate; forming a photoresist layer over the dielectric layer; patterning the photoresist layer to form through holes and a recess extending from a first one of the through holes to a second one of the through holes; conformally depositing a spacer layer over the patterned photoresist layer and lining sidewalls of the through holes and opposite sidewalls of the recess, wherein first and second portions of the spacer layer on the opposite sidewalls of the recess are merged together; removing a lateral portion of the spacer layer over the photoresist layer; after removing the lateral portion of the spacer layer over the photoresist layer, etching the dielectric layer using the patterned photoresist layer and the spacer layer as an etch mask to form via holes in the dielectric layer; forming a plurality of metal vias in the via holes. In some embodiments, the spacer layer is made of a different material than the metal vias. In some embodiments, the spacer layer is made of a different material than the dielectric layer. In some embodiments, the spacer layer is made of a metal-containing material. In some embodiments, removing the lateral portion of the spacer layer over the photoresist layer is performed such that a remainder of the spacer layer is embedded in the recess. In some embodiments, after removing lateral portion of the spacer layer over the photoresist layer, a remainder of the spacer layer on a sidewall of the first one of the through holes has a ring-shaped profile from a top view.

In some embodiments, the semiconductor structure includes a substrate, a dielectric layer, a first metal layer, a second metal layer, a first metal via, and a second metal via. The substrate includes a transistor. The dielectric layer is over the substrate. The first metal layer is in the dielectric layer. The second metal layer is in the dielectric layer and above the first metal layer. The first metal via is sandwiched between the first and second metal layers. The second metal via is sandwiched between the first and second metal layers. The second metal via has a first tip corner pointing toward the first metal via from a top view. In some embodiments, the first metal via has a second tip corner pointing toward the second metal via from the top view. In some embodiments, the first metal via has a circular pattern from the top view. In some embodiments, the second metal via has a second tip corner, and the first and second tip corners are on opposite sides of the second metal via from the top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
depositing a dielectric layer over a semiconductor substrate;
forming a first photoresist layer over the dielectric layer;
patterning the first photoresist layer to form through holes, such that a first portion of the first photoresist layer between a first one and a second one of the through holes has a less height than a second portion of the first photoresist layer between the first one and a third one of the through holes;
forming a spacer on the first portion of the first photoresist layer;
performing an etching process on the dielectric layer to form via holes while the spacer remains covering the first portion of the first photoresist layer; and
forming a plurality of metal vias in the via holes.
2. The method of claim 1, wherein from a top view, the first portion of the first photoresist layer has a width decreasing from the first one of the through holes to a middle position of the first portion of the first photoresist layer and increasing from the middle position of the first portion of the first photoresist layer to the second one of the through holes.
3. The method of claim 1, wherein the spacer is further formed on a sidewall of the first one of the through holes.
4. The method of claim 1, wherein the spacer has a top surface level with a top surface of the second portion of the patterned first photoresist layer.
5. The method of claim 1, wherein the spacer is made of a different material than the first photoresist layer.
6. The method of claim 1, wherein the spacer is made of a different material than the dielectric layer.
7. The method of claim 1, wherein the etching process also consumes the second portion of the first photoresist layer.
8. The method of claim 1, wherein the etching process etches the dielectric layer at a faster etch rate than it etches the spacer.
9. The method of claim 1, further comprising:
forming a second photoresist layer on the dielectric layer prior to forming the first photoresist layer.
10. The method of claim 9, further comprising:
forming a third photoresist layer on the dielectric layer prior to forming the second photoresist layer.
11. A method, comprising:
depositing a dielectric layer over a substrate;
forming a photoresist layer over the dielectric layer;
patterning the photoresist layer to form through holes and a recess extending from a first one of the through holes to a second one of the through holes;
conformally depositing a spacer layer over the patterned photoresist layer and lining sidewalls of the through holes and opposite sidewalls of the recess, wherein first and second portions of the spacer layer on the opposite sidewalls of the recess are merged together;
removing a lateral portion of the spacer layer over the photoresist layer;
after removing the lateral portion of the spacer layer over the photoresist layer, etching the dielectric layer using the patterned photoresist layer and the spacer layer as an etch mask to form via holes in the dielectric layer; and
forming a plurality of metal vias in the via holes.
12. The method of claim 11, wherein the spacer layer is made of a different material than the metal vias.
13. The method of claim 11, wherein the spacer layer is made of a different material than the dielectric layer.
14. The method of claim 11, wherein the spacer layer is made of a metal-containing material.
15. The method of claim 11, wherein removing the lateral portion of the spacer layer over the photoresist layer is performed such that a remainder of the spacer layer is embedded in the recess.
16. The method of claim 11, wherein after removing the lateral portion of the spacer layer over the photoresist layer, a remainder of the spacer layer on a sidewall of the first one of the through holes has a ring-shaped profile from a top view.
17. A method, comprising:
forming a first dielectric layer over a substrate, wherein the substrate comprises a transistor;
forming a first metal layer in the first dielectric layer;
depositing a second dielectric layer over the first dielectric layer;
forming a photoresist layer over the second dielectric layer;
patterning the photoresist layer to form through holes, such that a first portion of the photoresist layer between a first one and a second one of the through holes has a less height than a second portion of the photoresist layer between the first one and a third one of the through holes;

forming a spacer on the first portion of the photoresist layer;

performing an etching process on the second dielectric layer to form via holes while the spacer remains covering the first portion of the photoresist layer;

forming a first metal via in a first one of the via holes and over the first metal layer;

forming a second metal via in a second one of the via holes and over the first metal layer, wherein the second metal via has a first tip corner pointing toward the first metal via from a top view; and forming a second metal layer over the first and second metal vias.

18. The method of claim 17, wherein the first metal via has a second tip corner pointing toward the second metal via from the top view.

19. The method of claim 17, wherein the first metal via has a circular pattern from the top view.

20. The method of claim 17, wherein the second metal via has a second tip corner, and the first and second tip corners are on opposite sides of the second metal via from the top view.

* * * * *